(12) United States Patent
Daeche et al.

(10) Patent No.: US 7,221,048 B2
(45) Date of Patent: May 22, 2007

(54) MULTILAYER CIRCUIT CARRIER, PANEL, ELECTRONIC DEVICE, AND METHOD FOR PRODUCING A MULTILAYER CIRCUIT CARRIER

(75) Inventors: Frank Daeche, München (DE); Jochen Dangelmaier, Beratzhausen (DE); Stefan Paulus, Zeitlarn (DE); Bernd Stadler, Donaustauf (DE); Horst Theuss, Wenzenbach (DE); Michael Weber, Mainburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/046,892

(22) Filed: Feb. 1, 2005

(65) Prior Publication Data

US 2005/0151246 A1    Jul. 14, 2005

Related U.S. Application Data

(63) Continuation of application No. PCT/DE03/02575, filed on Jul. 31, 2003.

(30) Foreign Application Priority Data

Aug. 1, 2002    (DE)    ................ 102 35 332

(51) Int. Cl.
*H01L 23/12*    (2006.01)
*H01L 23/48*    (2006.01)

(52) U.S. Cl. ............ 257/690; 257/698; 257/699; 257/700; 257/701; 257/702; 257/703; 257/705; 257/706; 257/707; 257/708; 257/734; 257/773; 257/776; 257/778; 257/E23.003; 257/E23.009; 257/E23.062

(58) Field of Classification Search ............ None
See application file for complete search history.

(56) References Cited

U.S. PATENT DOCUMENTS

| | | | |
|---|---|---|---|
| 4,750,092 A | 6/1988 | Werther | |
| 5,322,593 A | 6/1994 | Hasegawa et al. | |
| 5,990,546 A | 11/1999 | Igarashi et al. | |
| 6,133,072 A | 10/2000 | Fjelstad | |
| 6,242,079 B1 | 6/2001 | Mikado et al. | |
| 6,420,788 B1 | 7/2002 | Chen | |
| 6,534,723 B1 | 3/2003 | Asai et al. | |
| 6,632,512 B1 | 10/2003 | Ito | |
| 6,873,060 B2 * | 3/2005 | Blaszczak et al. | .......... 257/787 |
| 2001/0023532 A1 | 9/2001 | Fujii et al. | |
| 2003/0102538 A1 | 6/2003 | Paulus | |

FOREIGN PATENT DOCUMENTS

| | | |
|---|---|---|
| JP | 08-241940 | 9/1996 |
| JP | 2000-114698 | 4/2000 |

\* cited by examiner

*Primary Examiner*—Jasmine Clark
(74) *Attorney, Agent, or Firm*—Edell, Shapiro & Finnan, LLC

(57) ABSTRACT

A multilayer circuit carrier, electronic devices and panel, and a method for producing a multilayer circuit carrier include at least one semiconductor chip, at least one rewiring layer with a rewiring structure, and at least one insulation layer, which has passage structures.

16 Claims, 16 Drawing Sheets

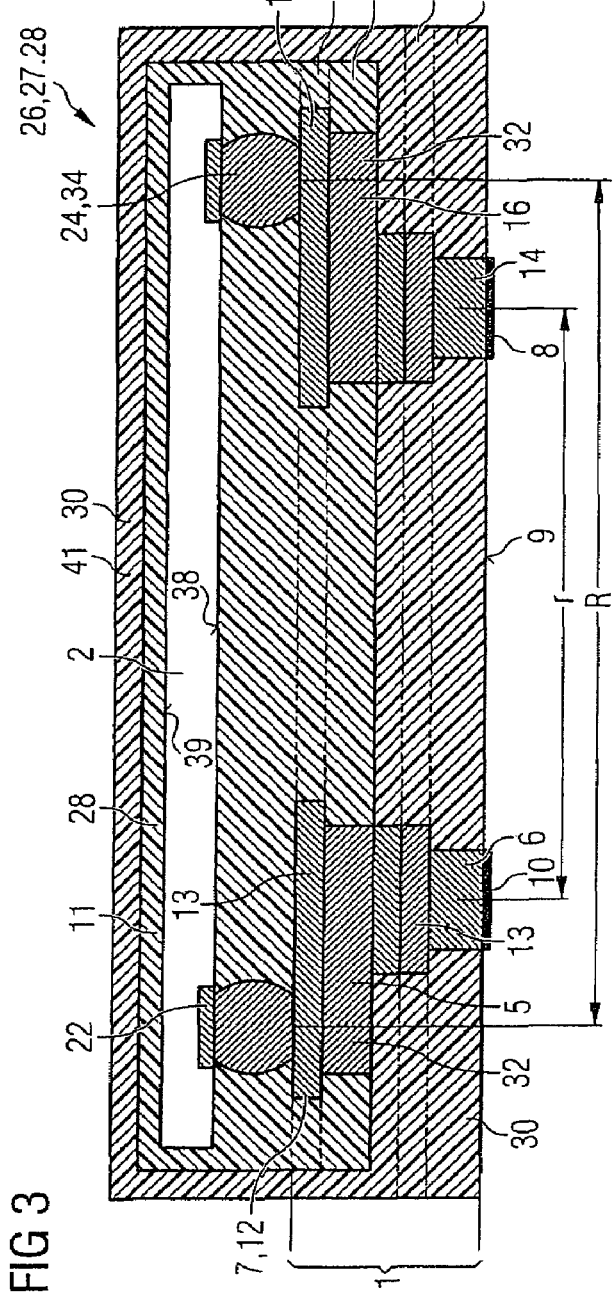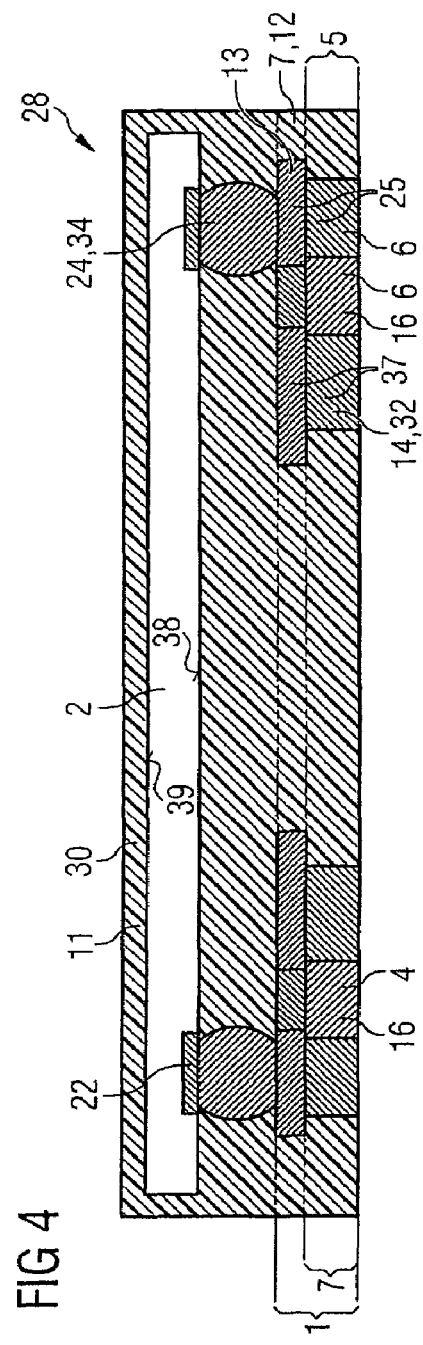

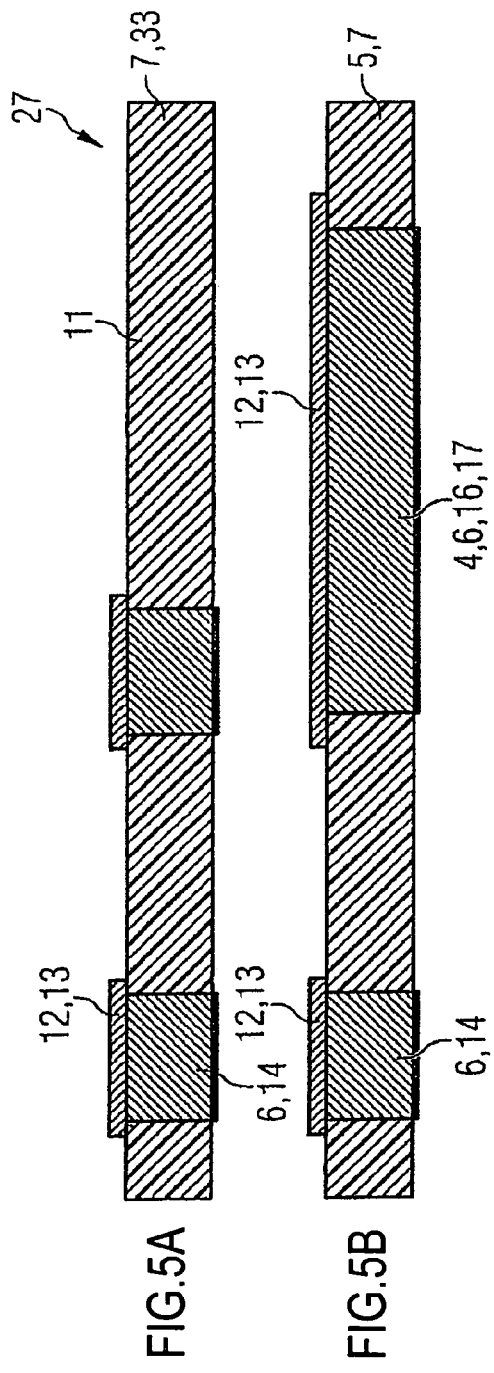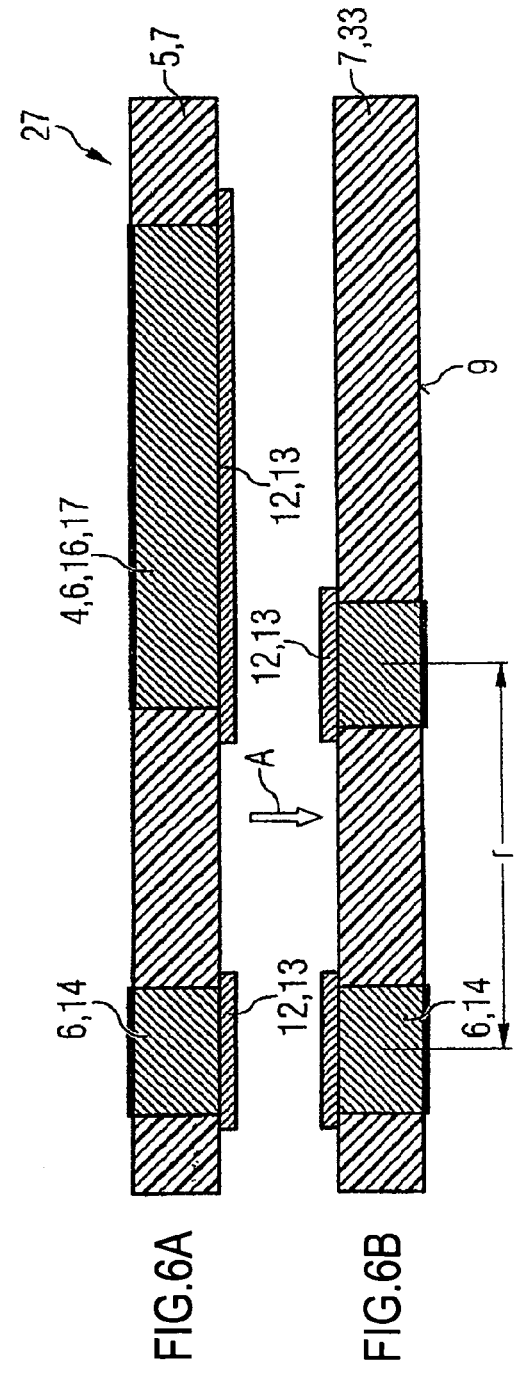

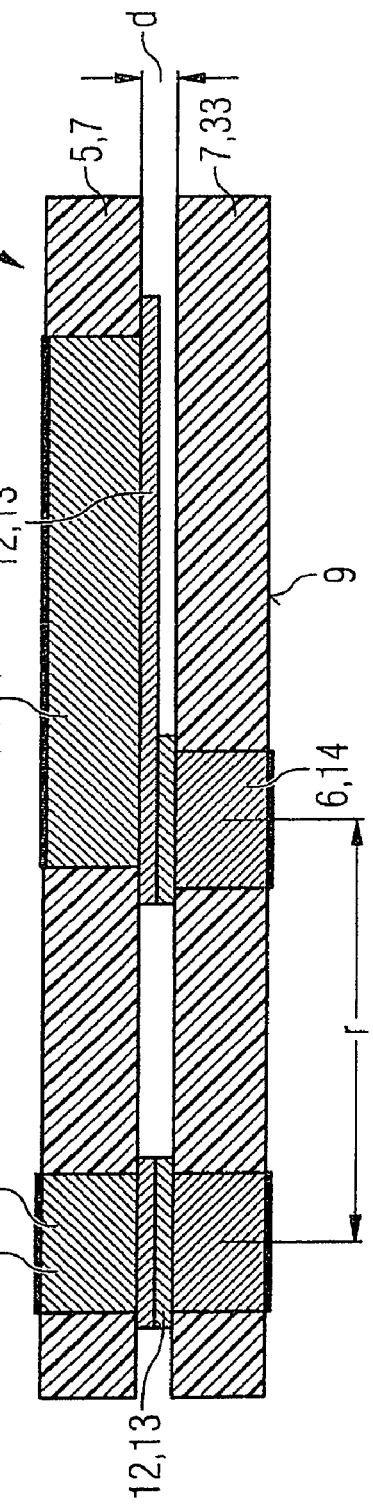
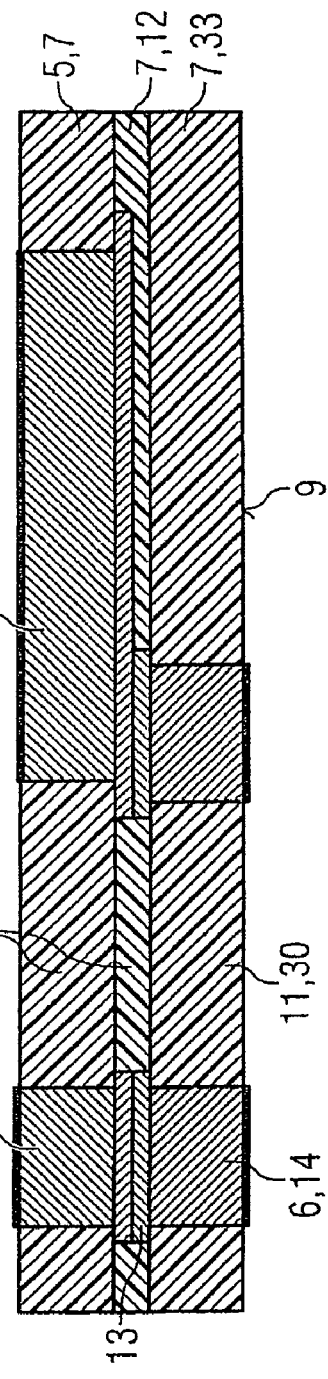

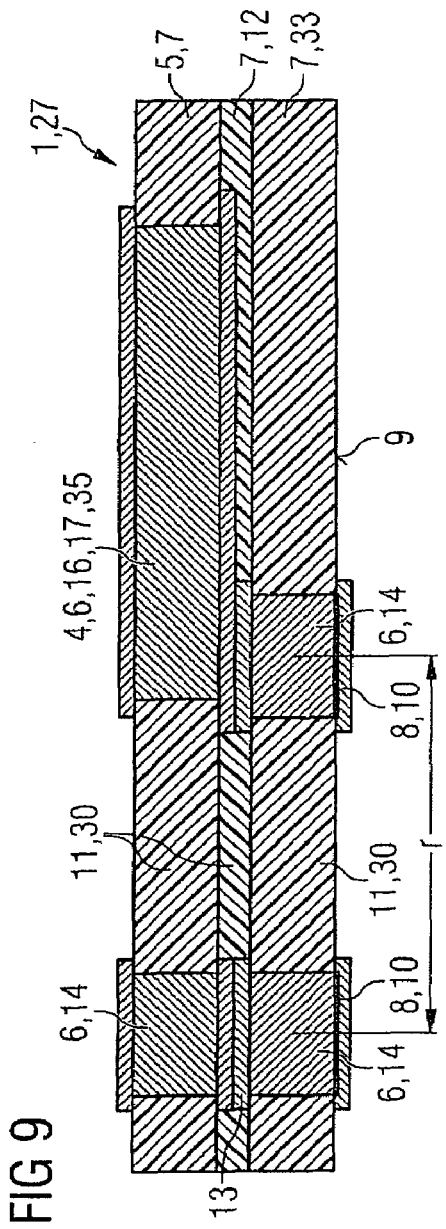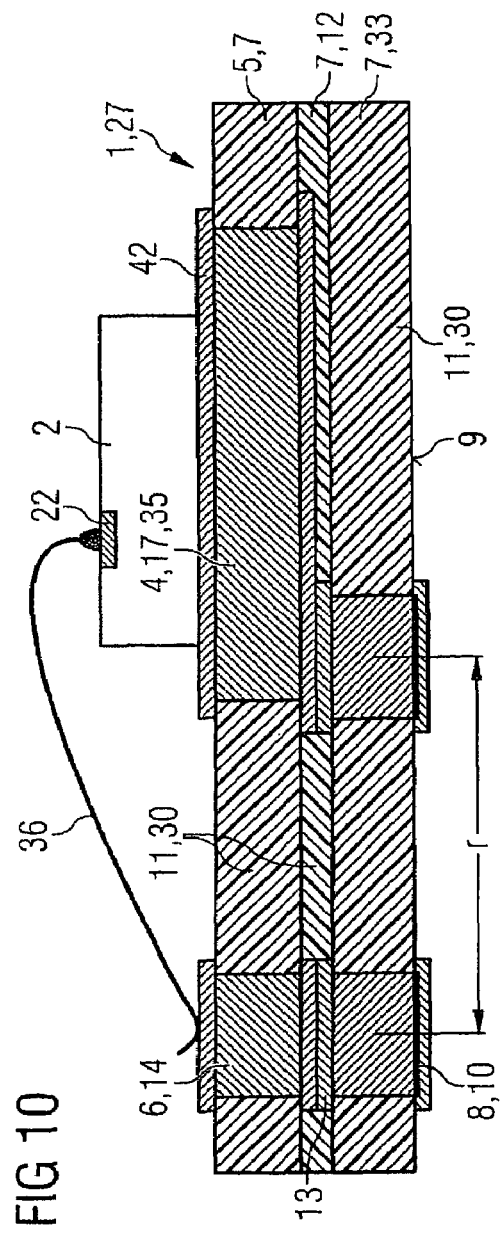

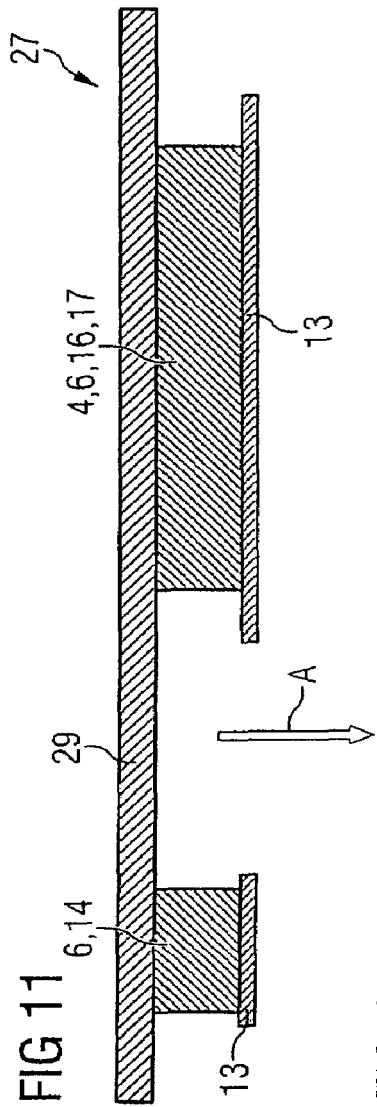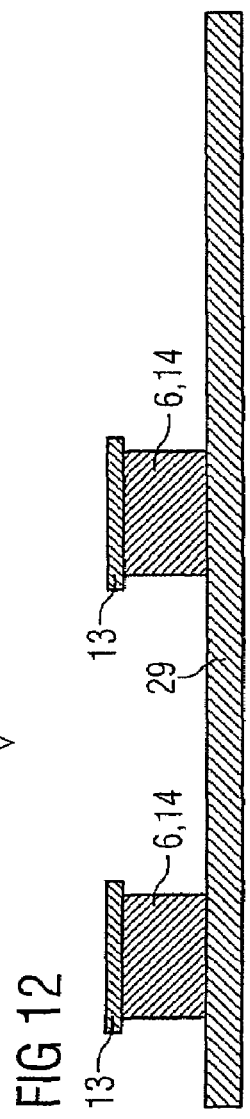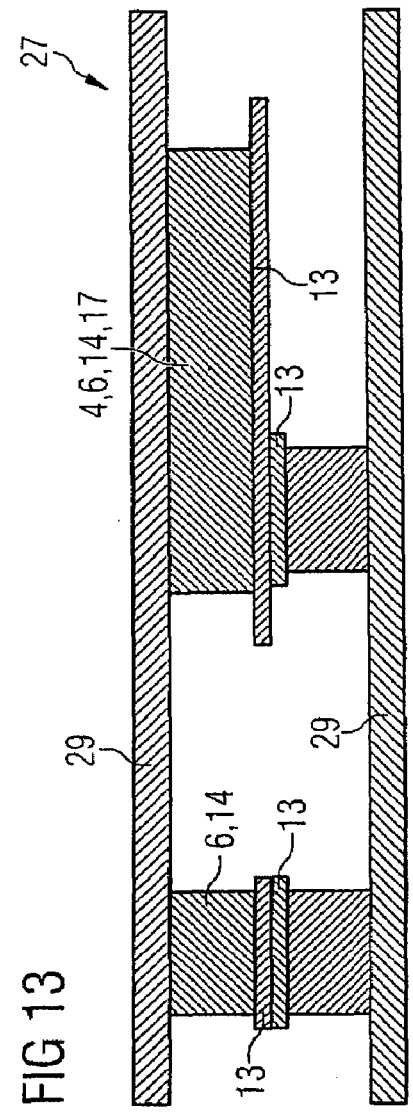

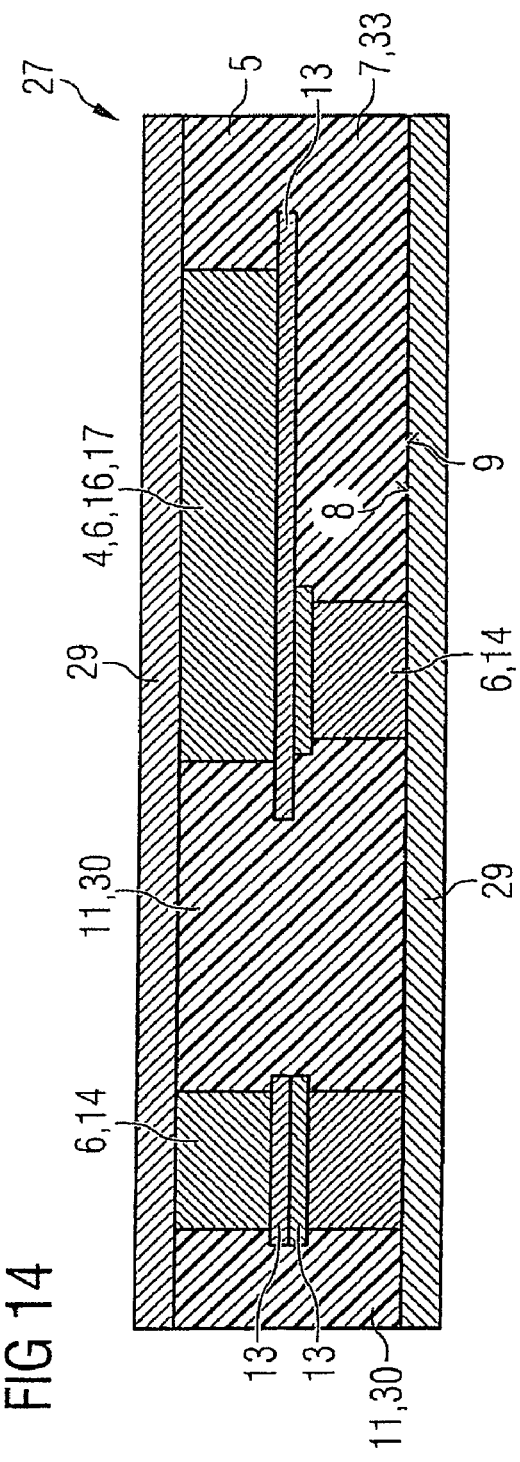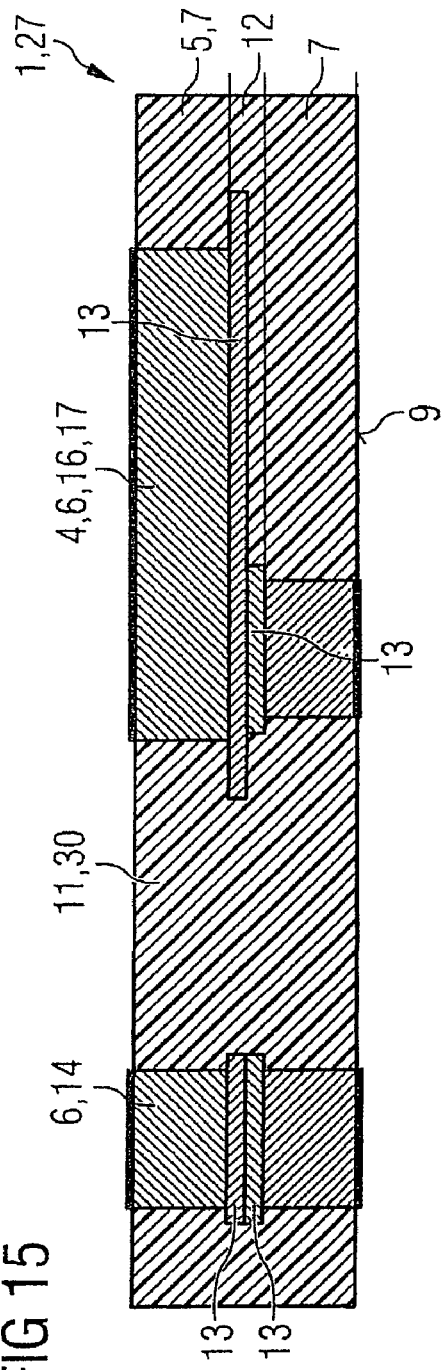

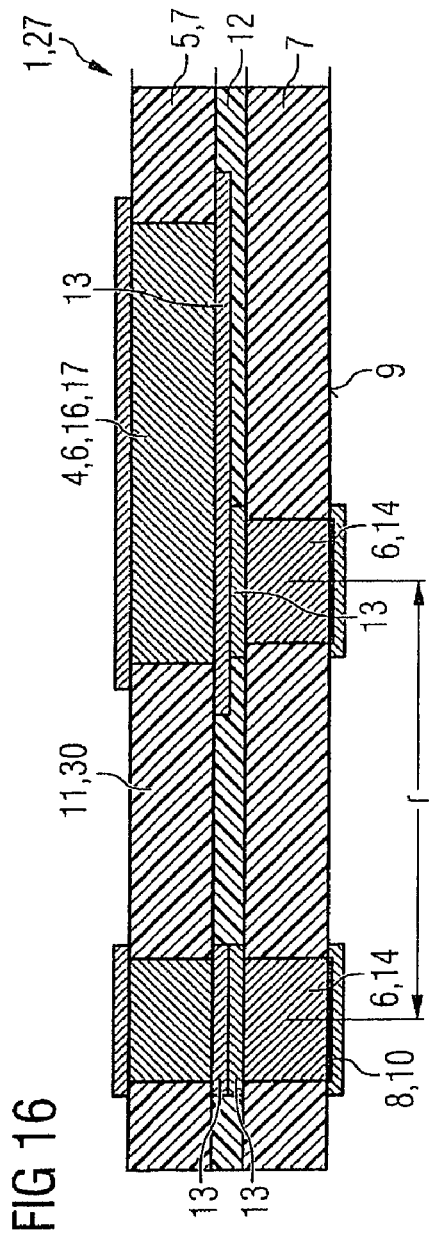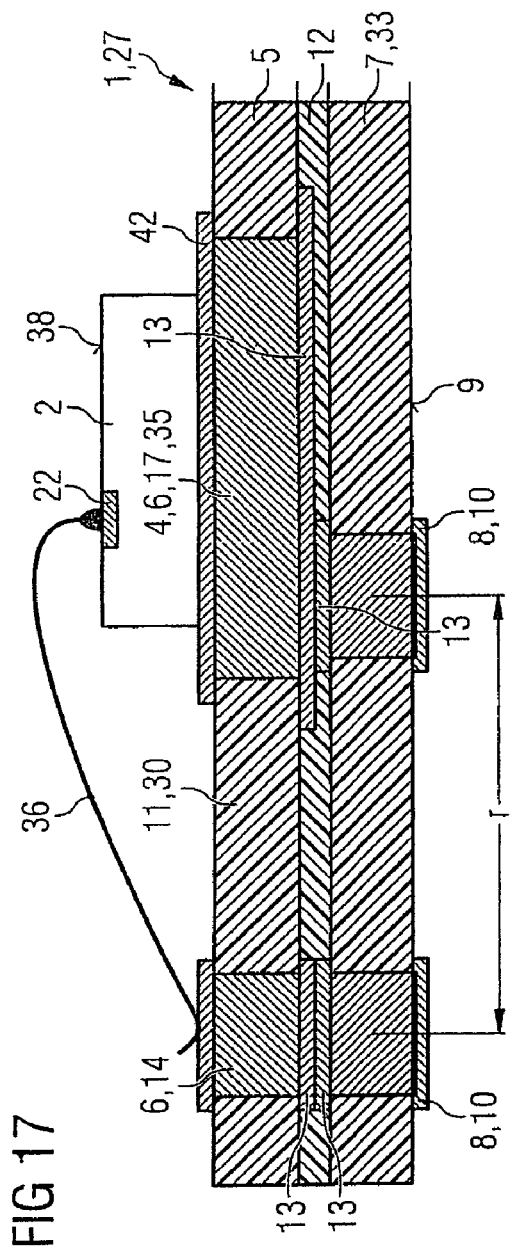

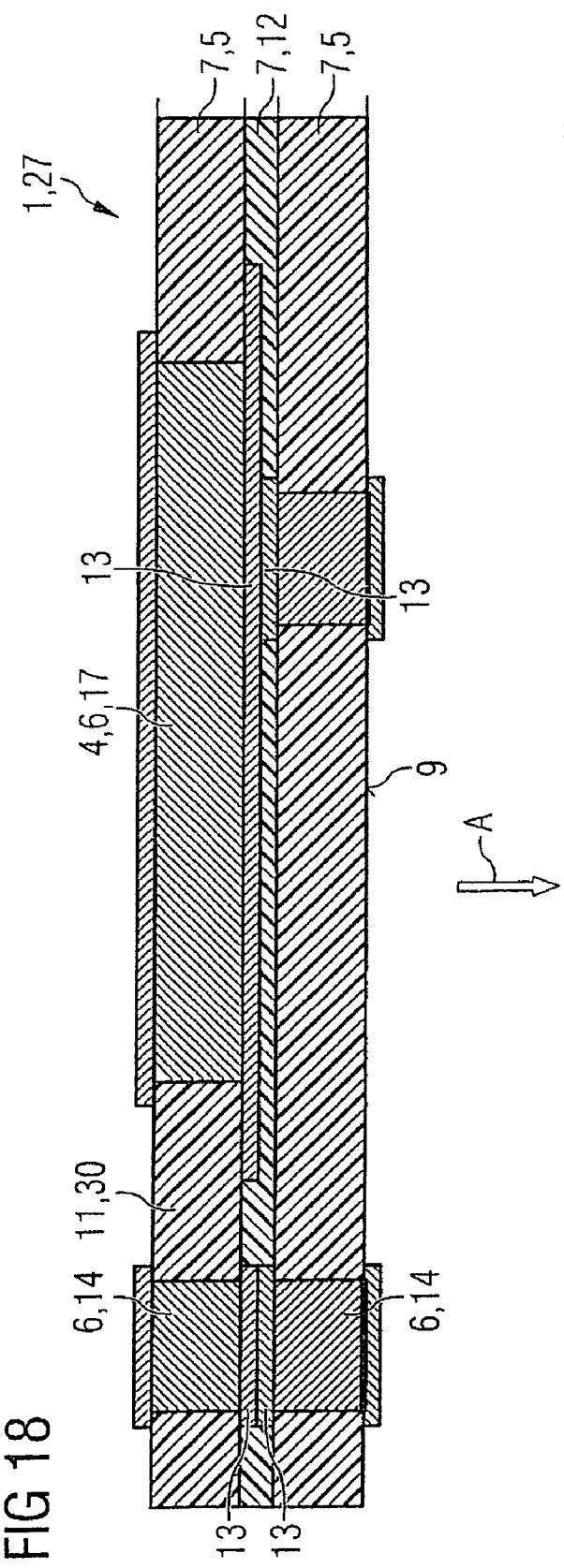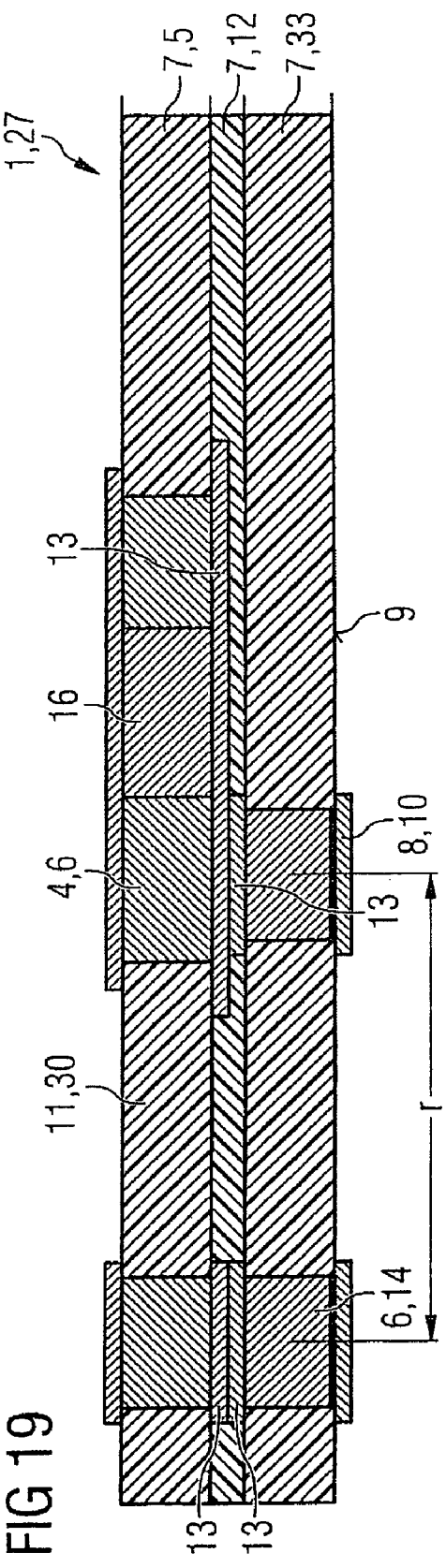

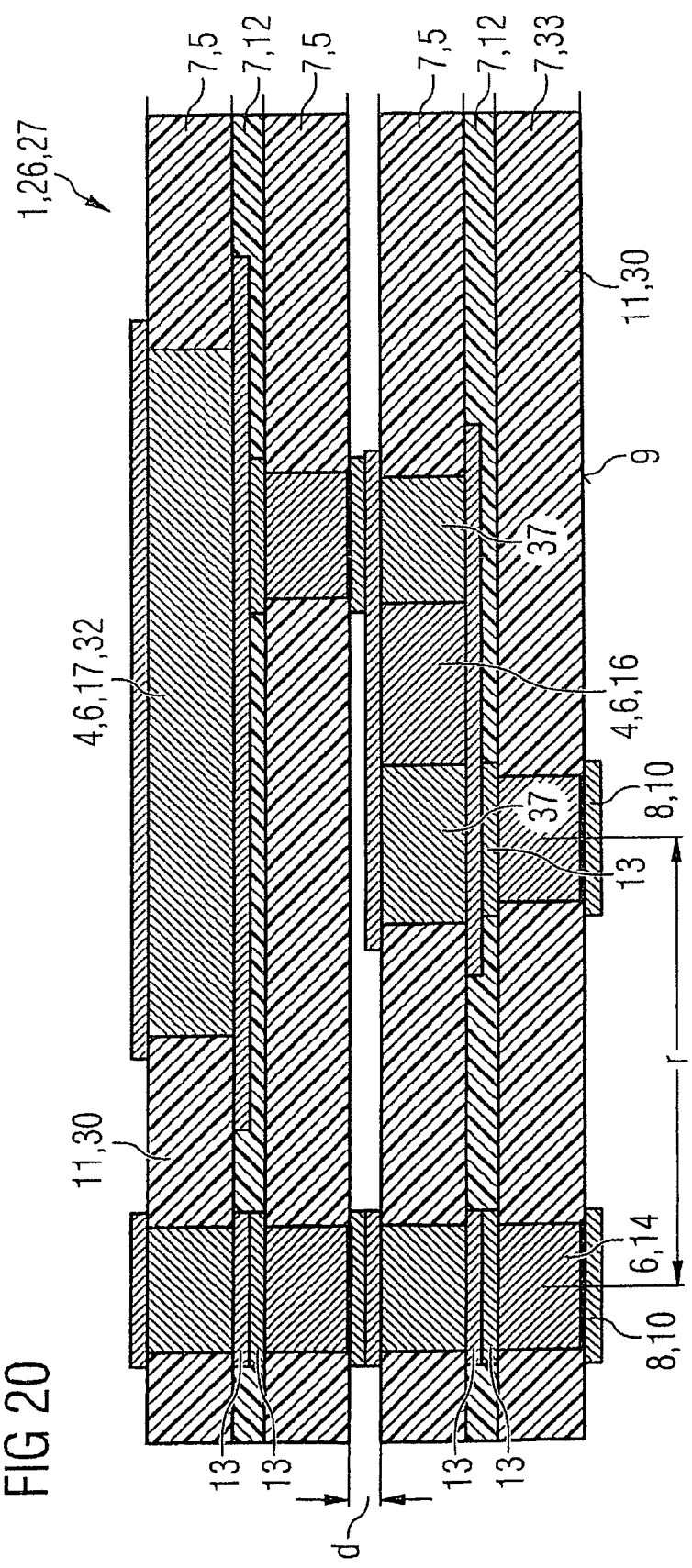

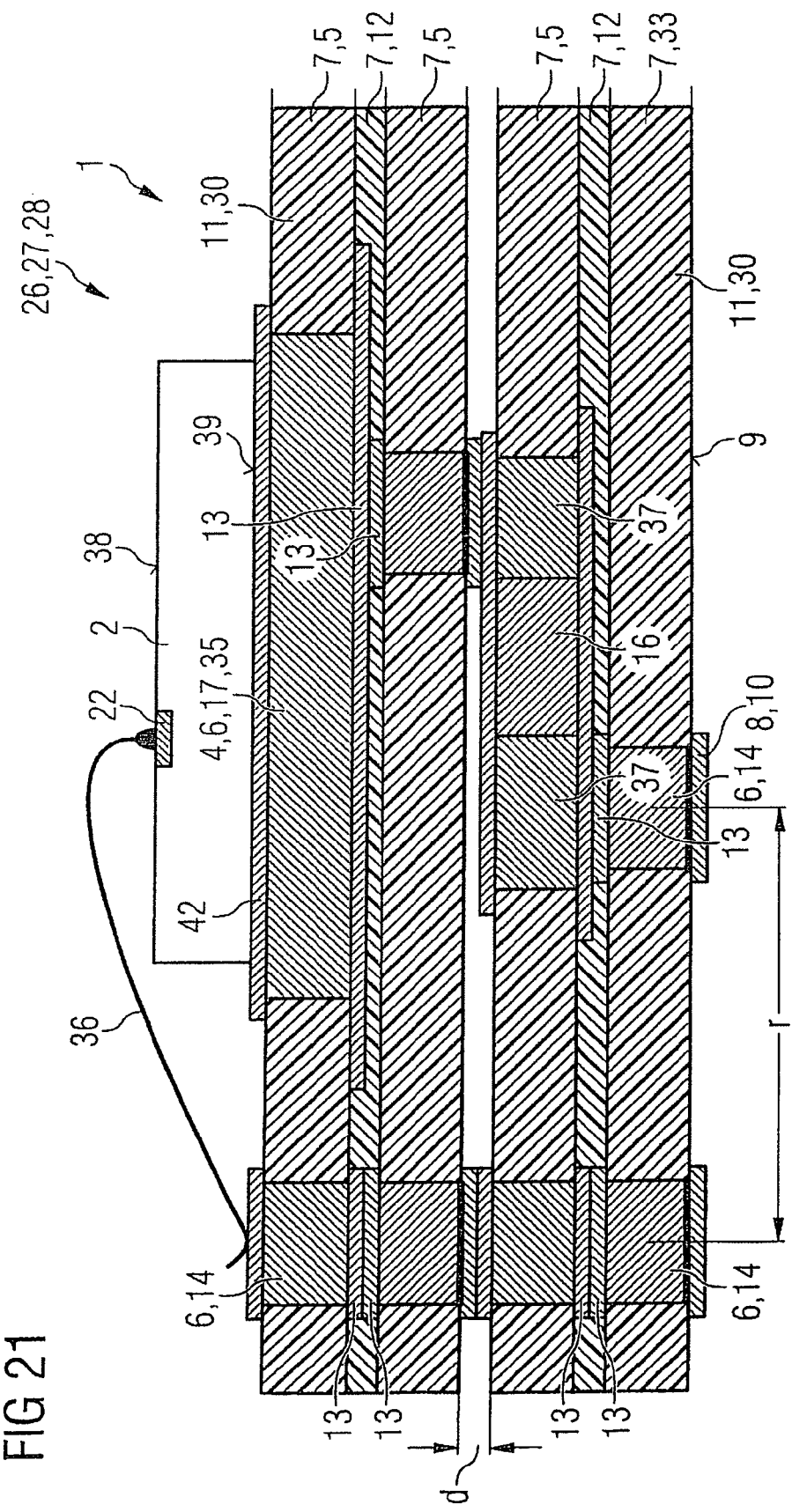

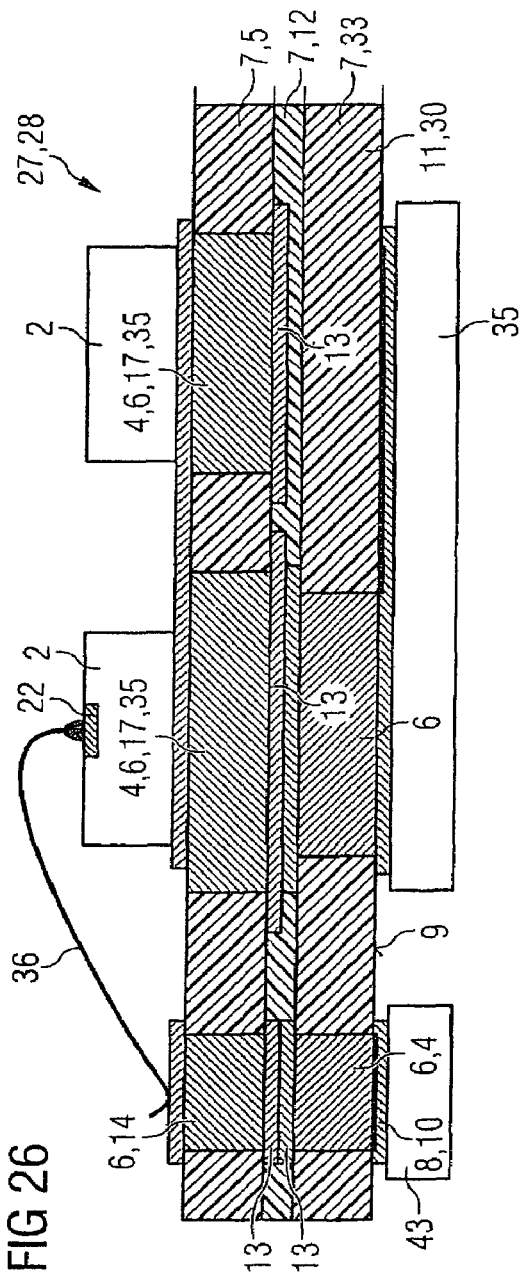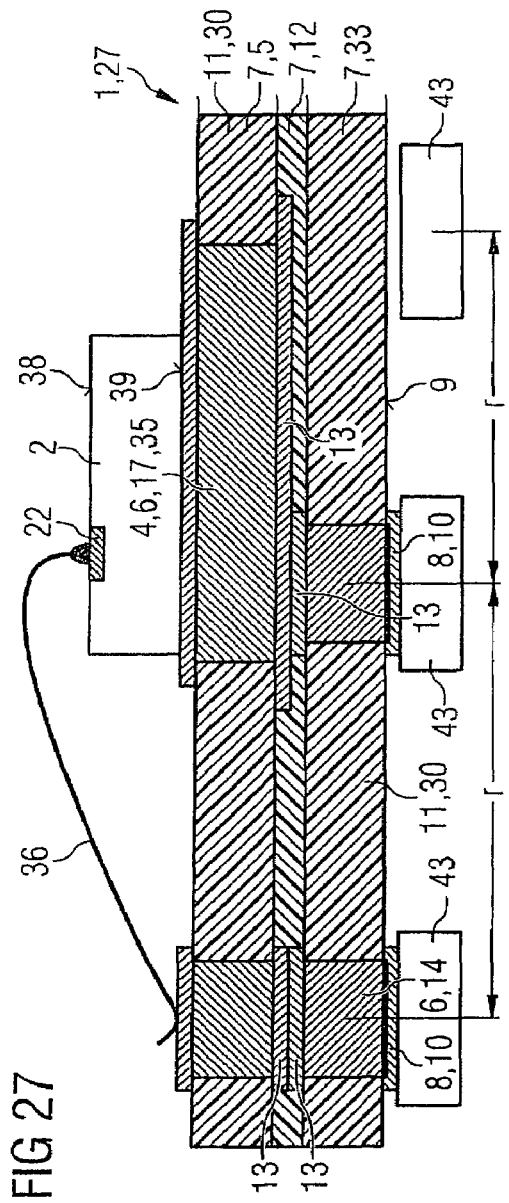

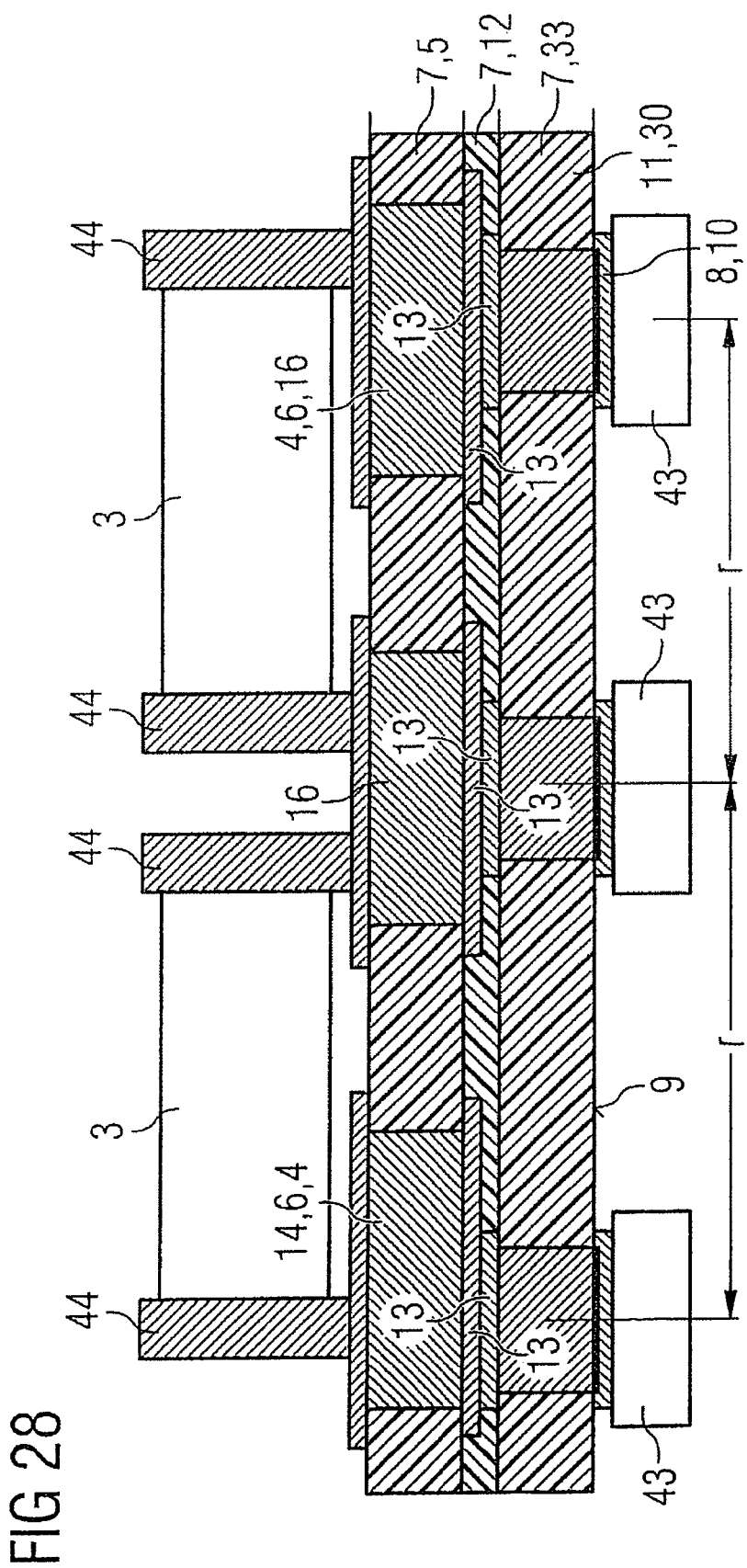

MULTILAYER CIRCUIT CARRIER, PANEL, ELECTRONIC DEVICE, AND METHOD FOR PRODUCING A MULTILAYER CIRCUIT CARRIER

CROSS REFERENCE TO RELATED APPLICATIONS

This application is a continuation of PCT/DE03/02575, filed Jul. 31, 2003, and titled "Multilayer Circuit Carrier and Production Thereof," which claims priority under 35 U.S.C. §119 to German Application No. DE 102 35 332.8, filed on Aug. 1, 2002, and titled "Multilayer Circuit Carrier and Production Thereof," the entire contents of which are hereby incorporated by reference.

FIELD OF THE INVENTION

The invention relates to a multilayer circuit carrier and a method of producing the same.

BACKGROUND

As the miniaturization and complexity of integrated circuits on semiconductor chips increase, the number and the packing density of microscopically small contact areas and/or microscopically small flip-chip contacts on the active top sides of the semiconductor chips increase. In order to arrange the multiplicity of microscopically small contact areas on a semiconductor chip, the pitch for the arrangement of such contact areas and/or flip-chip contacts of a semiconductor chip also have microscopically small chip sizes. In this context, microscopically small is understood to mean dimensions which can only be discerned and measured under a light microscope. In order to connect these microscopically small contact areas and/or flip-chip contacts to macroscopically large external contacts, of flat conductor frames, whose flat conductors provide microscopically small contact pads in the interior of a plastic or ceramic housing and undergo transition to macroscopically large external flat conductors toward the outside, are used. In this context, macroscopically large is understood to mean dimensions which can be discerned and measured with the naked eye.

This concept based on flat conductors has the disadvantage that only the outer edges of a circuit carrier can be used for fitting the external flat conductors, while the relatively large underside of the circuit carrier of an electronic device is not used for the arrangement of external contact areas. This is achieved only by flat-conductor-free technology with the aid of a rewiring body. In this case, a transition from the microscopically small pitch of the contact areas of a semiconductor chip to the macroscopic pitch of the external contact areas of an electronic device is possible by rewiring lines on an insulation plate. Such rewiring bodies include rewiring plates or rewiring sheets, which have a costly complex construction and increase the density of the rewiring lines and the density of the macroscopic external contact areas as the contact area density of the semiconductor chip increases. This means that the complexity of rewiring bodies increases in interaction with through contacts through the insulation plate of the rewiring body, so that costs rise and the probability of failure upon assembly of electronic devices on such rewiring bodies increases.

A circuit carrier with lower production costs for electronic devices and improved reliability is desirable.

SUMMARY

A multilayer circuit carrier has at least one semiconductor chip and/or at least one discrete component. Also, the multilayer circuit carrier has at least one rewiring layer, an insulation layer, and an anchoring layer. The rewiring layer has a rewiring structure, which has contact pads that are electrically connected to the microscopically small contact pads of the semiconductor chips. The rewiring structure has rewiring lines that have conductor tracks in the submicron range. Such rewiring structures have transition contacts to passage structures. The insulation layer has passage structures. The passage structures encompass through contacts and form continuous conductor tracks and/or continuous metal plates. According to the invention, the anchoring layer is arranged between the rewiring layer and the insulation layer and has anchor regions or metallic anchor laminae, which fix the position of the passage structures in the multilayer circuit carrier. Finally, an external contact layer is situated on the underside of the multilayer circuit carrier, and has external contact areas that are electrically connected to the rewiring structure via the passage structures and the anchor laminae. The external contact areas are arranged in a predetermined pitch on the underside of the circuit carrier. In this case, the anchor regions and the passage structures are produced in one piece.

Continuous conductor tracks differ from through contacts by extending over the full height of an insulation layer. The position of continuous conductor tracks is secured by anchor laminae in the multilayer circuit carrier. Continuous metal plates differ from metal structures by extending over the full height of an insulation layer and securing their position in a multilayer circuit carrier by anchor laminae.

The multilayer circuit carrier has external contact areas at a predetermined pitch, which renders external flat conductors, which are arranged only at the edges of an electronic device, dispensable.

Moreover, in the multilayer circuit carrier, each element of the passage structures is secured by anchor laminae. Finally, the multilayer circuit carrier can be formed in large-area fashion and, in a plurality of device positions, have at least one semiconductor chip and/or at least one discrete component. Such device positions may be arranged as an individual row one behind the other or in rows and columns on the multilayer circuit carrier. Such measures make it possible to reduce the costs for producing electronic devices or electronic modules.

The insulation layer with a passage structure forms a substrate layer, which has through contacts in a predetermined pitch corresponding to the pitch of the external contact areas. In order to fix the through contacts of a substrate layer in a multilayer circuit carrier, each through contact has an anchor lamina with an area larger than the cross section of the through contacts.

The rewiring structure has electrically conductively filled plastic. In the case of such plastics, the filling includes metal particles, such as silver particles. The circuit carrier can be added to by additional rewiring layers with rewiring structures made of electrically conductively filled plastic. In this case, through contacts that have electrically conductively filled plastic can be arranged in intermediate layers made of insulation material. This results in an overall construction for a multilayer circuit carrier which, apart from the substrate layer with its metallic through contacts, has exclusively filled plastics.

Alternatively, rather than producing the rewiring structure in the rewiring layer from electrically conductively filled plastic, the rewiring layer can be formed from a further insulation layer. That is, the structures that characterize a rewiring layer can also be present as passage structures, have either continuous conductor tracks and/or continuous metal plates, instead of or in addition to the through contacts, and replace the rewiring layers. During production of the multilayer circuit carrier, one method variant for producing the circuit carrier layers is used. Consequently, the multilayer circuit carrier only has insulation layers with passage structures, which are stacked one above the other. The anchoring layer with its anchor laminae on surface regions of each passage structure ensures that circuit bridges and circuit crossovers can be realized in the multilayer circuit carrier and a defined distance between the individual insulation layers with rewiring structures remains ensured.

Alternatively, the circuit carrier has two insulation layers with passage structures. The anchor layers of the insulation layers are arranged with their anchor laminae one on top of the other. This structure of a pair wise arrangement of the insulation layers with passage structures on the one hand doubles the distance between the passage structures of the respective layer since two anchor laminae are arranged one on top of the other. Moreover, this pair wise arrangement of two insulation layers with passage structures facilitates the embedding of the passage structures in a plastic housing composition, since the distance to be filled between the passage structures is enlarged.

In the case of such pair wise arrangement of insulation layers with anchor laminae, one of the anchor lamina has an eutectic solder, while the other anchor lamina has another eutectic solder, so that a low connecting or joining temperature can be achieved when joining the anchor laminae one on top of the other. For such eutectic solders, one of the anchor laminae of the pair can have gold or a gold alloy and the other of the anchor laminae of the pair can have tin or a tin alloy. Thus, a connection of a gold-tin eutectic can be formed at a low solder temperature. Similarly, one of the two joining partners can have anchor laminae with a gold coating and the other of the joining partners can have anchor laminae with an aluminum coating.

One of the insulation layers of a multilayer circuit carrier can have a cutout as a hollow housing. The cutout receives at least one semiconductor chip and/or a discrete component. This insulation layer, which is formed with a hollow housing, can form the topmost layer of the multilayer circuit carrier and at the same time terminate the circuit carrier with inclusion of the at least one semiconductor chip and/or the at least one discrete component in its cutout.

In such an embodiment of the invention, the insulation layer with passage structures can be used in three places, for example, in the bottommost layer of the layer sequence as substrate layer with through contacts and anchor laminae in an anchoring layer on the insulation layer. An insulation layer with passage structures has continuous conductor tracks and/or continuous metal plates besides through contacts, which carries at least one semiconductor chip and/or at least one discrete component. An insulation layer formed as a hollow housing with the at least one semiconductor chip and/or the at least one discrete component arranged in the cutouts is arranged as the termination of the multilayer circuit carrier.

Such multilayer circuit carriers with buried semiconductor chips and/or buried discrete components form a compact device housing in each device position of the multilayer circuit carrier which has an relatively small device thickness and has a predetermined arrangement of external contact areas which are connected to semiconductor chips and/or discrete components within the electronic device or within the multilayer switch plate.

By constructing one of the insulation layers of a multilayer circuit carrier from transparent plastic, the transparent plastic can form a hollow housing and provide image and/or radiation detection. The hollow housing of transparent plastic, which is provided as a layer of a multilayer circuit carrier, allows electromagnetic waves to reach the surface of the semiconductor chip and/or the discrete component in an unattenuated fashion. The multilayer circuit carrier with semiconductor chip can thus form a light and/or UV and/or IR detector. Moreover, the transparent plastic can be formed above the semiconductor chip or above the discrete component, such as a photoresistor, as detector lens, thereby amplifying the detector efficiency.

One of the insulation layers of a multilayer circuit carrier can have a continuous metal plate. The metal plate is formed as a shielding plate. The opposite effect of shielding a semiconductor chip and/or discrete component from electromagnetic waves is possible. Besides a detector lens or a shielding plate, this insulation layer formed as housing can have through contacts in order to ensure an electrical connection from the underside of the circuit carrier populated with external contact areas to the top side of the circuit carrier. A continuous metal plate as a chip island can receive a semiconductor chip on one of its sides. The lowest potential of an electronic circuit can be routed to the chip island on the other side of the metal plate. If such a continuous metal plate is used as a chip island, then the contact areas of the active top side of the semiconductor chip may be connected to the rewiring structure via bonding connections. The rewiring structure can have continuous contact pads in addition to continuous conductor tracks. The bonding wires of the bonding connection can be electrically connected to contact pads.

Another possibility for preparing a semiconductor chip with contact areas for the multilayer circuit carrier includes providing flip-chip contacts on the contact areas of the semiconductor chip. The flip-chip contacts can be provided as a real contact structures or contact balls or contact bumps for flip-chip contacts. For connecting semiconductor chips which are prepared for a flip-chip connecting technique, continuous contact pads are provided besides continuous conductor tracks. The semiconductor chip are applied using flip-chip technology to the contact pads.

In the case of rewiring structures made of electrically conductively filled plastic, continuous contact pads are not provided. Rather, contact pads are arranged on an insulating layer, so that through contacts lead through the insulating layer.

If the multilayer circuit carrier is provided for a plurality of device positions, then it can be separated into individual devices after application of the at least one semiconductor chip or of the at least one component and after embedding of these electronic elements in an insulation layer made of a plastic housing composition or by covering the electronic elements with an insulation layer which is formed as hollow housing. The costs for the individual devices can be reduced since the multilayer circuit carrier simultaneously forms the housing for a plurality of individual electronic devices.

A plurality of circuit carriers including insulation layers arranged in pairs with passage structures are stacked and connected via through contacts to form a panel which likewise has a plurality of device positions for electronic devices and can then be divided into individual electronic devices.

The electronic devices that are separated from a multilayer circuit carrier or from a panel can have a rewiring structure made of conductive plastic. The conductive plastic can match the surrounding plastic housing composition in terms of its thermal expansion behavior to prevent thermomechanical stresses in the plastic housing. The through contacts of the bottommost insulation layer, which also forms a basis as a substrate layer, can be released from the plastic. However, this is prevented by the anchoring layer, which is arranged between an insulation layer and a rewiring layer, and its anchor laminae.

A further electronic device including such multilayer circuit carriers or such panels can have a stack of a semiconductor chip on an insulation layer with elongated through contacts and an insulation layer with through contacts in a predetermined pitch of external contact areas. With such elongated through contacts, the external contacts can be arranged with their pitch beneath the area of the semiconductor chip, which corresponds to a "fan-in," and outside the region of the semiconductor chip, which corresponds to a "fan-out." This is understood to mean a region of the external contact layer which is arranged outside the projection of the semiconductor chip area onto the external contact layer, while external contact areas beneath the semiconductor chip encompasses the external contact areas arranged within the projection of the semiconductor chip area onto the external contact layer. The elongated through contacts form continuous conductor tracks in order to adapt the pitch of the contact areas of a chip to the predetermined pitch of the external contacts in the external contact layer.

In this connection, the predetermined pitches of a flat conductor carrier are adapted to predetermined distances of discrete electronic components by a multilayer circuit carrier. Specifically, the multilayered circuit carrier according to the invention is also suitable for adapting discrete electronic components with their electrodes to predetermined pitches of a flat conductor frame if, for example, input or output capacitances between individual flat conductors of a flat conductor frame or input and/or output inductances of an electronic circuit between flat conductor connections are to be electrically adapted or adjusted.

A method for producing a multilayer circuit carrier having at least one rewiring layer, an anchoring layer, an insulation layer, which has passage structures, and an external contact layer includes providing a metal plate for producing an insulation layer with passage structures, applying a photoresist layer to the metal plate for passage structures, patterning the photoresist layer while leaving free areas on which passage structures can be deposited. Chemically depositing or electrodepositing passage structures on the free areas of the metal plate, removing the photoresist layer from the metal plate, applying a thermally stabilized plastic housing composition while embedding the passage structures and leaving free surface regions of the passage structures, curing the plastic housing composition, and removing the metal plate.

An anchoring layer is applied to the self-supporting insulation layer with passage structures by selectively depositing anchor laminae on the surfaces of the passage structures. The areas of the anchor laminae are larger than the surface regions of the passage structures that have been left free. A rewiring layer can subsequently be applied to the anchoring layer by selective application of a rewiring structure to the anchoring layer. In this case, the anchor laminae simultaneously serve as through contacts to the electrically conductive rewiring structure. The multilayer circuit carrier can then be completed by application of at least one semiconductor chip and/or at least one discrete component.

The anchoring layer and the anchor laminae embedded in the anchoring layer fulfill a dual function in that they mechanically secure the position of the passage structures and serve as through contacts for connection to the electrically conductive rewiring structure. As a result, at least one additional insulation layer with correspondingly voluminous through contacts is saved and the height of the insulation layer that is otherwise necessary is reduced to the height of the anchoring layer. Saving one complete additional method step makes it possible to reduce the overall costs of the method for producing a multilayer circuit carrier.

The electrically conductive rewiring structure can be patterned from conductive plastic by photolithography and/or printing technology. In this case, photolithography technique is used for the microscopically small patterning of contact pads which correspond to the contact areas of a semiconductor chip since it can more precisely realize structures in the micrometers range. On the other hand, a printing techniques are used if rewiring structures are to be formed as intermediate layers, for example, for a multilayer circuit carrier having a plurality of rewiring layers arranged one above the other. In these cases, stencil printing and/or screen printing and/or jet printing may be used as printing techniques. In this connection, jet printing encompasses techniques which work with a printing jet and can print a conductive plastic structure with such a pulsed plastic jet. For the conductive region of the rewiring layer, a plastic may be filled with conductive particles, such as silver particles. For the insulating region of a rewiring layer, the plastic may be filled with correspondingly insulating particles.

By a multi-jet printing system, insulating plastic regions and conductive plastic regions can be applied simultaneously, which provides a cost advantage in terms of method technology. Moreover, jet printing techniques can realize finer structures for the rewiring structure than screen printing or stencil printing techniques, so that it is possible to dispense with photolithographic steps for critical dimensions, which again lowers the method costs. If, for miniaturization reasons and reasons of compactness, a multilayer circuit carrier will have a plurality of rewiring layers that are stacked and staggered one above the other, then the above-mentioned techniques can be used to provide as many insulation layers as desired with rewiring layers arranged thereon on the circuit carrier, insulation layers with through contacts and insulation layers with rewiring structures being applied alternately.

In the case of this method, different technologies for realizing a multilayer circuit board are employed for producing a substrate layer, which includes an insulation layer with through contacts and which carries an external contact layer with external contacts in a predetermined pitch. In principle, after completion of the self-supporting first insulation layer or substrate layer, individual polymer layers are applied which serve as rewiring layers or as insulation layer.

By contrast, a further method in which the same technology is used both for creating insulation layers as substrate layer with through contacts and for producing insulation layers with passage structures avoids special techniques for producing rewiring structures and reduces costs for producing a multilayer circuit carrier.

A method for producing a multilayer circuit carrier having at least two insulation layers arranged in pairs includes providing at least two metal plates for producing the two insulation layers with passage structures, applying and patterning photoresist layers where the metal plates are covered with photoresist while leaving free areas on which passage structures deposited as through contacts and/or as rewiring structure in the form of continuous conductor tracks and/or continuous metal plates, chemically depositing or electrodepositing passage structures in the free areas, removing the photoresist from the metal plates, applying a thermally stabilized plastic housing composition while embedding the passage structures and while leaving free surface regions of the passage structures, removing the two metal plates so that two self-supporting insulation layers with passage structures are available, selectively applying an anchoring layer selectively on the self-supporting insulation layers with passage structures, applying anchor laminae having a larger area than the surface regions of the passage structures that have been left free to the passage structures, and joining the insulation layers with passage structures together in pairs while connecting the anchor laminae of the anchoring layers. This pair wise joining together of the anchor laminae gives rise to a distance between the insulation layers with passage structures to prevent short circuits apart from at the desired positions of the anchor laminae.

The interspace between the insulation layers can be filled with thermally stable plastic housing composition. After the production of such a multilayer circuit carrier including insulation layers joined together in pairs, the carrier is completed by applying at least one semiconductor chip and/or at least one discrete component. Thus, a multilayer circuit carrier based on a single patterning technology for passage structures is created. As a result, this method enables mass production based on metal plates on which patterned passage structures are produced by chemical deposition or electrodeposition. On an insulation layer which only has through contacts to external contact areas in a predetermined pitch, a second insulation layer is formed by connecting or joining together the respective anchor laminae of the respective anchoring layer with a small distance of twice the magnitude of the anchor laminae thickness arising between the insulation layers with through contacts.

This distance lies between 3 and 10 µm and can be filled with plastic housing composition. While the lower insulation layer only has through contacts, the upper insulation layer has further passage structures, such as continuous conductor tracks and continuous metal plates and also continuous contact pads and continuous connecting contacts. Consequently, with its passage structures, the upper insulation layer replaces a separately produced rewiring, thereby reducing the production costs of this method relative to the method explained previously.

If, after etching away the metal layers, the stability of the insulation layers is not sufficient to constitute a self-supporting insulation layer and to apply the further method steps thereto, such as the application of an anchoring layer, then removing the metal plate can occur after applying the anchoring layer, which is associated with a higher stability for the fitting and alignment of the anchoring layer. A critical point of this method is the small distance between the insulation layers with passage structures, which is filled with plastic housing composition. This step can be avoided by a further improved method.

For this purpose, a method is specified which serves for producing a multilayer circuit carrier having at least two insulation layers arranged in pairs. These insulation layers again have passage structures, the lower insulation layer has through contacts, and the upper insulation layer forms a rewiring layer with its passage structures.

First, metal plates for producing insulation layers with passage structures are provided. Photoresist layers are then applied to the metal plates and the photoresist layers are patterned such that areas of the metal plates which serve for the application of passage structures are left free. Such passage structures have through contacts and/or a rewiring structure in the form of continuous conductor tracks or continuous metal plates. The passage structures are chemically deposited or electrodeposited on the free areas of the metal plates. Afterward, anchoring layers are applied directly by selective application of anchor laminae on the surfaces of the passage structures. The anchor laminae have a larger area than the surfaces of the passage structures. Afterward, the photoresist layers are removed on both metal plates and the insulation layers with passage structures are then joined together in pairs while connecting the anchor laminae of the anchoring layers.

Consequently, the intermediate step of producing self-supporting insulation layers with passage structures is eliminated. Rather, the passage structures, which are situated on the metal plates in this method, are joined together with their anchor laminae made of metal, thus giving rise to a cavity structure which is delimited toward the outside by two opposite metal plates. The two joined-together rewiring structures are arranged between the metal plates. The delimiting metal plates can simultaneously serve as encapsulation molds for injecting a plastic housing composition between the metal plates while embedding the passage structures and the anchor laminae of the two insulation layers. After these steps the metal plates are removed, so that a self-supporting double layer including insulation layers arranged in pairs with through contacts is available for the further construction of a multilayer circuit carrier.

In order to complete the circuit carrier, at least one semiconductor chip and/or at least one discrete component is applied to the insulation layers arranged in pairs with passage structures. The metal plates are simultaneously retained as a mold until passage structures of two insulation layers are connected to one another via corresponding anchor laminae, so that, for embedding the rewiring structures with the anchor laminae, a larger cavity is available for the injection of plastic housing composition. This increases the reproducibility and reliability of this method compared with the methods explained previously.

In an exemplary implementation of the methods explained previously, an insulation layer is produced as substrate layer with through contacts, which are provided in the pitch of external contact areas. The lower insulation layer of the multilayer circuit carrier is created. The lower insulation layer can also be the basis or first substrate layer of a panel which, besides the insulation layer as substrate layer, has further insulation layers with passage structures which are stacked one on top of the other or may be arranged in pairs and then stacked. In the case of pair wise stacking, the second insulation layer of a pair can be produced as a rewiring layer with rewiring structures in the form of continuous conductor tracks and/or continuous metal plates and/or through contacts and also continuous contact pads and continuous transition contacts.

Since both the substrate layer and the rewiring layer are effected using the same technology by chemical deposition or electrodeposition on a patterned metal plate, the overall method for producing a multilayer circuit carrier can be standardized and normalized based on a single technology, which permits the expectation of a considerable cost saving. For this purpose, the passage structures are deposited in the form of through contacts and/or continuous conductor tracks and/or continuous metal plates or continuous contact pads or continuous transition contacts on a metal plate made of a copper alloy. The chemically deposited or electrodeposited metal can have a nickel alloy, which differs from a copper alloy in terms of its etching behavior, so that, during the later removal of the metal plate, an etching stop occurs at the transition from the copper alloy to the nickel alloy.

A further method improvement resides in the fact that a copper-coated sheet for the chemical deposition or electrodeposition of nickel is provided on a carrier plate. Such a copper-coated sheet is just as suitable for the chemical or galvanic application of passage structures as a metal plate. The copper-coated sheet can be stripped from the self-supporting body after production of a self-supporting insulation layer or after production of a self-supporting stack of insulation layers with passage structures, so that an etching or a mechanical removal of a metal plate is obviated. The self-supporting body can then be cleaned of copper residues of the copper coating.

Two technologies are available for removing the metal plate by etching technology: dry etching with the aid of a plasma and wet etching with the aid of a metal etchant. Wet etching can provide an etching stop through the choice of different materials for the metal plate and for the chemically deposited or electrodeposited passage structures. In the case of plasma etching, such etching stops can be dispensed with, so that it is possible to deposit materials of the same type on metal plates or with metallized sheets. Plasma etching can be used, moreover, for cleaning the surfaces in order, for example, to remove the copper coating of a copper-coated sheet after the sheet has been stripped from an insulation layer.

A plurality of technologies are possible for application of anchor laminae. In the case of chemical deposition, the patterning photoresist layer can be mirror-coated at the same time as filling the structures on the metal plate, so that only one etching mask has to be applied in order to remove the excess material apart from the metal laminae. In the case of galvanic application of the passage structures on a metal plate, a mushroom-cap-shaped enlargement of the passage structures can be provided by momentarily continuing the electrodeposition after the filling of the structures, thus giving rise to an overgrowth of the electrodeposition of the passage structures. Anchor laminae arise on the passage structures in this case, too, which ensure an anchoring of the passage structures in the plastic housing composition that is subsequently to be applied.

If very precise anchor laminae are intended to be produced, then it is possible firstly to apply or mirror-coat the surface of the insulation layer with a metal film by vapor deposition, sputtering or chemical vapor deposition and this mirror-coated surface may subsequently be patterned by photolithography to form individual anchor laminae. A further possibility for producing anchor laminae consists in printing technology, by printing anchor laminae onto the surfaces of the passage structures, in which case it is possible to work with a mask which correspondingly selectively applies anchor laminae on the surface by screen printing technology or stencil printing technology, or by using a printing jet technique which writes on the top sides of the passage structures and in this case prints metal particles with binder onto the passage structures.

In order to complete the multilayer circuit carrier with semiconductor chips, it is possible to apply semiconductor chips to the circuit carrier using flip-chip technology. In the case of a flip-chip technology, the semiconductor chip is provided with flip-chip external contacts which can be applied directly on contact pads of the topmost insulation layer with passage structures. In the case of a rewiring structure made of electrically conductive plastic, it is likewise possible to apply such a semiconductor chip with flip-chip external contacts to the corresponding contact pads. Such a flip-chip technique can eliminate a bonding step. In the case of bonding, in order to complete the multilayer circuit carrier, semiconductor chips are applied to correspondingly prepared continuous metal plates by their rear side, while contact areas on the active top side of the semiconductor chips are connected via bonding wires and/or via bonding tapes to corresponding contact pads on the passage structures or on the rewiring structure.

The multilayer circuit carrier can include buried semiconductor chips because an insulation layer with or without through contacts and with depressions is applied as topmost layer of the multilayer circuit carrier, in which case hollow housings are produced by the depressions. After application of such a topmost layer, the multilayer circuit carrier becomes a panel with a plurality of device positions. The panel is separated in order to produce individual electronic devices.

A flat-conductor-free multilayer circuit carrier with electrodeposited or chemically deposited metal structures has a space between the metal structures filled with nonconductive epoxy material and forms the basis for further layer constructions. In this case, the surface of the metal structures is spared by mask technology. A conductive layer can then be applied to these uncovered metal structures which can be multilayer and a semiconductor may be applied on a topmost layer using flip-chip technology.

Multichip packages and multichip modules can be realized by such a multilayer circuit carrier. The rewiring planes obtained in the individual insulation layers with passage structures enable contact-making arrangements to be realized independently of the "footprint" or of the predetermined pitch of the external contact areas of a housing package. This saves basic areas compared with flat conductor constructions and can be useful in radiofrequency applications since the linking of the external contact areas to the semiconductor chip can be made very short. The various passage structures, rewiring structures and also anchor laminae can be produced very precisely by mask technology, where printing techniques are particularly inexpensive.

Completed mounted flat-conductor-free housings can be mounted in a relatively larger flat-conductor-free housing, which can be repeated multiply, whereby arbitrary rewirings can be relatively simple. This technique is very flexible and cost-effective and permits rapid mounting.

BRIEF DESCRIPTION OF THE DRAWINGS

The invention will now be explained in more detail on the basis of embodiments with reference to the accompanying figures FIG. 3 shows a schematic cross section of an electronic device with a multilayer circuit carrier of a third embodiment of the invention, FIG. 4 shows a schematic cross section of an electronic device of a preliminary stage of the electronic device in accordance with FIG. 3, FIGS. 5A to 10 show schematic cross sections through intermediate products in the production of a multilayer circuit carrier with a semiconductor chip in each device position of the multilayer circuit carrier of a fourth embodiment of the invention, where FIGS. 5A and 5B show schematic cross sections through two self-supporting insulation layers with passage structures, FIGS. 6A and 6B show schematic cross sections through two self-supporting insulation layers with passage structures and applied anchor laminae, FIG. 7 shows a schematic cross section through a pair of joined-together insulation layers with anchor laminae lying one on top of the other, FIG. 8 shows a schematic cross section through a pair of joined-together insulation layers with a filled interspace between the insulation layers, FIG. 9 shows a schematic cross section through a pair of joined-together insulation layers with applied external contact areas, and FIG. 10 shows a schematic cross section through a multilayer wiring carrier with semiconductor chip on a continuous metal plate as chip island, FIGS. 11 to 17 show schematic cross sections through intermediate products in the production of a multilayer circuit carrier with a semiconductor chip in each device position of the multilayer circuit carrier of a fifth embodiment of the invention, where FIG. 11 shows a schematic cross section through a metal plate with passage structures and with anchor laminae on the passage structures, FIG. 12 shows a schematic cross section through a metal plate with through contacts and with anchor laminae on the through contacts, FIG. 13 shows a schematic cross section through the metal plates of FIGS. 11 and 12 after the anchor laminae have been joined together, FIG. 14 shows a schematic cross section through the metal plates joined by anchor laminae according to FIG. 13 with filled cavities between the metal plates, FIG. 15 shows a schematic cross section through a self-supporting multilayer circuit carrier, FIG. 16 shows a schematic cross section through a self-supporting multilayer circuit carrier with applied external contact areas, and FIG. 17 shows a schematic cross section through a component position of a multilayer circuit carrier with applied semiconductor chip, FIGS. 18 to 21 show schematic cross sections through intermediate products in the production of a panel with a semiconductor chip in each device position on the basis of a multilayer circuit carrier of a sixth embodiment of the invention, where FIG. 18 shows a schematic cross section through a pair of two insulation layers with passage structures, FIG. 19 shows a schematic cross section through a further pair of two insulation layers with passage structures, FIG. 20 shows a schematic cross section through the pairs of FIGS. 18 and 19 after the two pairs have been joined together, and FIG. 21 shows a schematic cross section through a multilayer circuit carrier with a semiconductor chip, FIG. 26 shows a multilayer circuit carrier of a eleventh embodiment of the invention, FIG. 27 shows a multilayer circuit carrier of a twelfth embodiment of the invention, and FIG. 28 shows a multilayer circuit carrier of a thirteenth embodiment of the invention.

DETAILED DESCRIPTION

Figure 1:
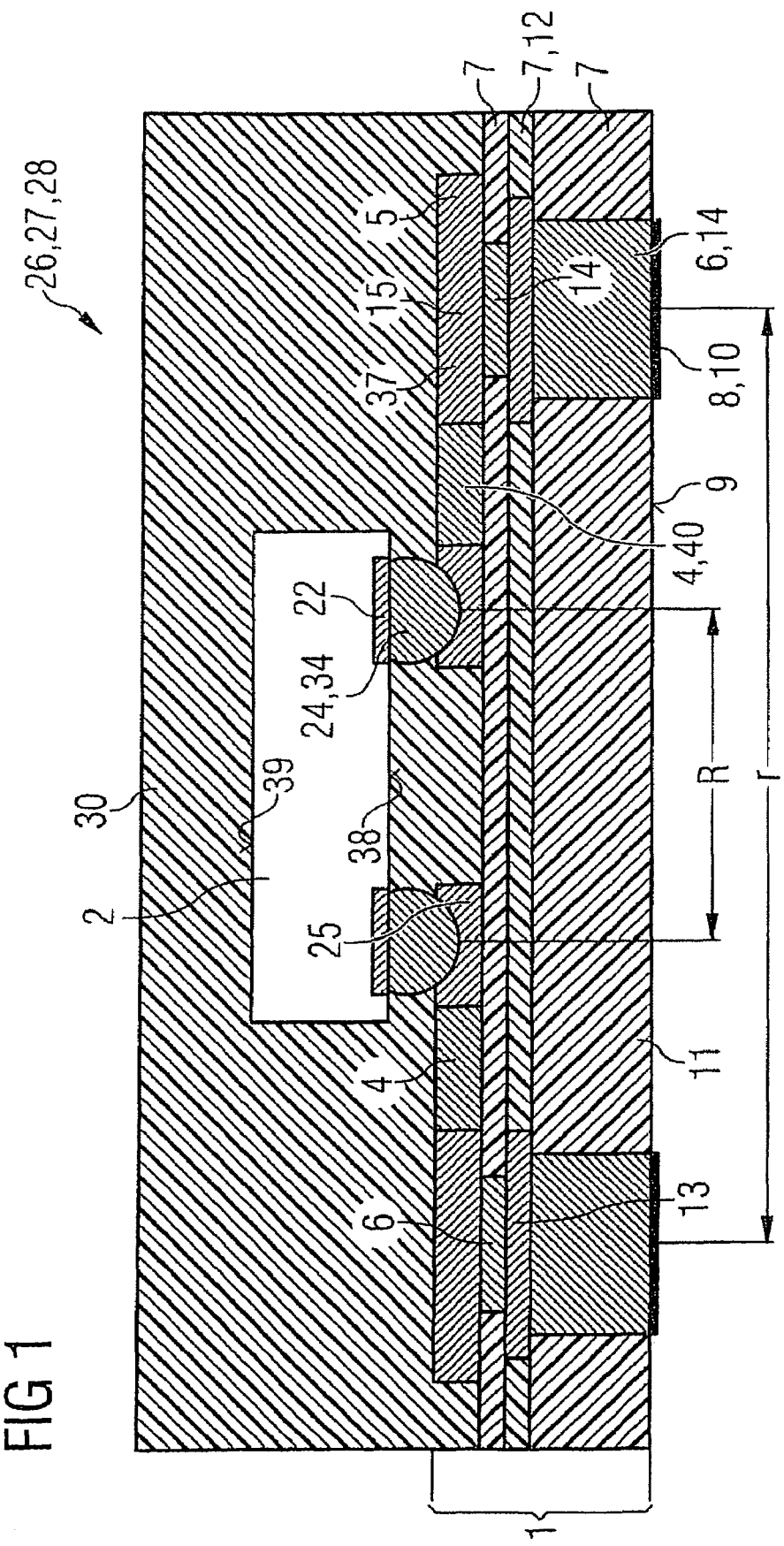
FIG. 1 shows a schematic cross section of an electronic device with a multilayer circuit carrier of a first embodiment of the invention.

FIG. 1 shows a schematic cross section of an electronic device 28 with a multilayer circuit carrier 1 of a first embodiment of the invention. The reference symbol 2 identifies a semiconductor chip and the reference symbol 4 identifies a rewiring structure, which forms a topmost layer of the multilayer circuit carrier 1 and is identified as rewiring layer 5. The reference symbol 6 identifies passage structures, which are produced by different technologies in this first embodiment of the invention. The reference symbol 7 identifies an insulation layer with passage structures 6. Here three insulation layers are stacked one on top of the other in this first embodiment of the invention. The reference symbol 8 identifies external contact areas arranged on the underside 9 of the multilayer circuit carrier 1.

In this first embodiment of the invention, the external contact areas 8 are covered with a layer that forms an external contact 10. The reference symbol 11 identifies a plastic, which forms the nonconductive part of each insulation layer 7. The plastic 11 can be a plastic filled with insulation particles, such as, for example, an epoxy resin filled with correspondingly nonconductive oxide or carbide particles.

The reference symbol 12 identifies an anchoring layer, which includes plastic 11 and forms a special insulation layer since the plastic 11 has electrically conductive metallic anchor laminae 13. The anchor laminae 13 provide an electrical conduction function and a mechanical anchoring function. The reference symbol 14 identifies through contacts, which are present in the three insulation layers 7 in the first embodiment of the invention. The through contacts 14 provide mechanical anchoring in the anchoring layer 12. The reference symbol 15 identifies an electrically conductively filled plastic which, in this embodiment of the invention, forms the topmost layer of the circuit carrier and thus the rewiring structure 4. The through contacts 14 of the topmost insulation layer can also be constructed from such an electrically conductively filled plastic.

The reference symbol 22 identifies contact areas of the semiconductor chip 2 on its active top side 38. The reference symbol 24 identifies contact balls that are arranged on the contact areas 22 and form flip-chip external contacts 34. The semiconductor chip 2 is embedded with its external contacts in a plastic housing composition 30. The plastic housing composition 30 can have the same material as the plastic 11 of the insulation layers. Since, in this first embodiment of the invention, the rewiring structure 4 as topmost layer of the multilayer circuit carrier 1 is also made of plastic, which, however, is filled with electrically conductive particles, the semiconductor chip 2 with its flip-chip external contacts 34 is completely surrounded by plastic.

The transition from plastic to metal is effected at the transition to the metallic anchor laminae 13 in the anchoring layer 12. The anchor laminae 13 serve as a through contact function and mechanically secure the position of the through contacts 14 in the bottommost insulation layer 7, which, in this first embodiment of the invention, is formed as substrate layer 33 and thus has a relatively greater thickness than the overlying anchoring layers and the topmost insulation layer 7. The substrate layer can be a self-supporting substrate and have a plurality of device positions arranged in columns and rows. This substrate layer 33 is thus the prerequisite in order to simultaneously apply further layers for a plurality of devices, such as the anchoring layer 12 with its anchoring laminae 13 or the overlying insulation layer with its plastic leadthroughs 14, and also the topmost layer, which, in this first embodiment of the invention, comprises an electrically conductive rewiring structure and is covered by the plastic housing composition 30.

In order to produce such a device 28 of the first embodiment of the invention, the substrate layer 33 is constructed as insulation layer 7 with through contacts 14 on a continuous metal plate (not shown, i.e., already removed and no longer present in FIG. 1), which is carried out by electrodeposition or chemical deposition of the through contacts 14 on areas of the metal plate left free for the deposition of such through contacts 14. After production of the through contacts 14, the anchoring layer 12 with the anchor laminae 13 of metal is deposited in patterned fashion on the top sides of the through contacts 14. A plurality of methods have been described for this purpose.

In the first embodiment of the invention as shown in FIG. 1, the anchor laminae 13 of the anchoring layer 12 are applied selectively with the aid of printing technology. A patterned insulation layer 7 is subsequently introduced, which leaves free at least parts of the anchor laminae for application of the through contacts 14 made of electrically conductively filled plastic 15. A fourth layer of electrically conductively filled plastic 15 is applied to these three insulation layers 7 in patterned fashion. This layer forms the rewiring structure 4 and has conductor tracks 40, transition contacts 37, and also contact pads 25.

The semiconductor chip 2 can be applied to the contact pads 25 into each of the device positions 27 (shown in cross section in this exemplary embodiment). In this embodiment of the invention, the pitch r of the external contact areas 8 and thus of the external contacts 10 is greater than the pitch R of the flip-chip external contacts 34. The difference between the two is bridged by the conductor tracks 40 of the rewiring structure 4. Thus, independently of the predetermined pitch r of the external contacts of the electronic device 28, semiconductor chips 2 are accommodated in the housing made of plastic housing composition 30, which have a pitch R for their flip-chip external contacts 34 which deviates from the predetermined pitch r.

Figure 2:
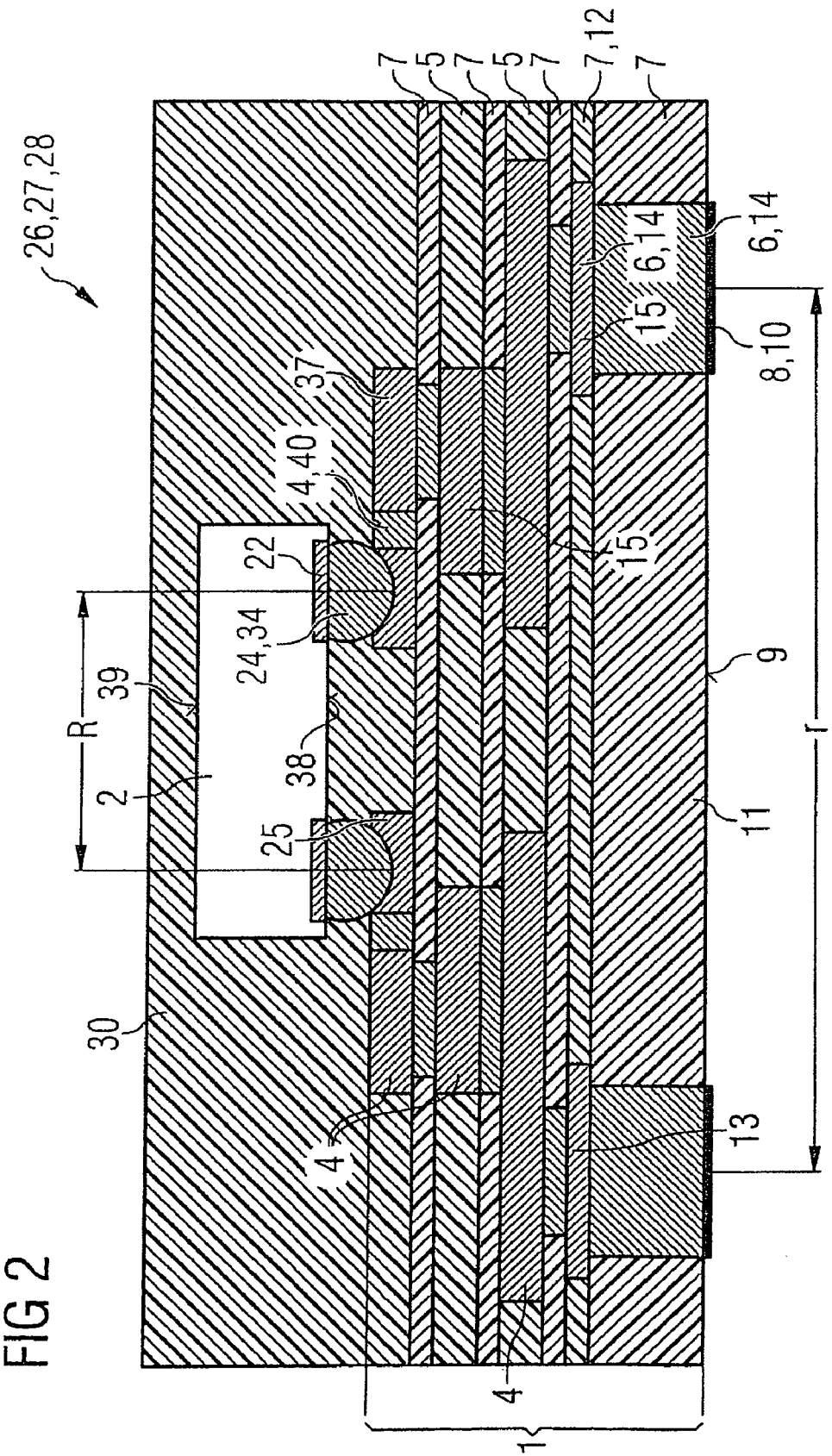
FIG. 2 shows a schematic cross section of an electronic device with a multilayer circuit carrier of a second embodiment of the invention.

FIG. 2 shows a schematic cross section of an electronic device 28 with a multilayer circuit carrier 1 of a second embodiment of the invention. Components having functions identical to those in FIG. 1 are identified by the same reference symbols and are not discussed separately.

The second embodiment of the invention also proceeds from a substrate layer 33 which has through contacts 14 and an anchor lamina 13 arranged above each through contact 14 in order to secure the position of the through contacts 14 in the plastic 11. Differing from the first embodiment of the invention, there are seven insulation layers are arranged one above the other in order to compensate for the difference between the pitch R of the flip-chip external contacts 34 and the predetermined pitch r of the external contact areas of the substrate layer 33. While the through contacts 14 are applied chemical deposition or electrodeposition technology on a metal plate, which has already been removed, and thus have a metal, the further through contacts 14 in the overlying insulation layers 7 are produced from an electrically conductively filled plastic 15.

In this second embodiment of the invention, a total of three rewiring structures 4 are embedded in three rewiring layers 5 arranged one above the other, the topmost rewiring layer 5 being electrically connected to the flip-chip external contacts 34 of the semiconductor chip 2, so that an arbitrary pitch R of the flip-chip external contacts 34 can undergo transition to a predetermined pitch r of the external contact areas 8. With the aid of the rewiring structures stacked multiply one above the other and the associated through contacts, it is possible to produce conduction bridges and to realize mutually crossing conduction tracks that are insulated from one another.

While the metallic through contacts 14 of the substrate layer 33 are chemically deposited or electrodeposited, the remaining conductive structures are produced by printing technology. In the case of printing technology, masks such as a screen printing mask or a stencil are used or to carry out jet printing, rewiring patterns are written successively. Such jet printing systems work according to the principle of inkjet printers, except with the difference that here, instead of the ink, a liquid plastic filled with electrically conductive particles, in particular, nanoparticles, is printed in the structure of a rewiring layer or in the structure of passage contacts. During the subsequent curing of the plastics, the low-viscosity binder of the printed rewiring structure can simultaneously escape and a compact, electrically conductive rewiring structure can form.

FIG. 3 shows a schematic cross section of an electronic device 28 with a multilayer circuit carrier 1 of a third embodiment of the invention. Components having functions identical to those in the previous figures are identified by the same reference symbols and are not discussed separately.

The third embodiment of the invention differs from the first two embodiments of the invention in that a larger pitch R of the flip-chip external contacts 34 is intended to be reduced to a predetermined smaller pitch r for the external contact areas 8 with the aid of the multilayer circuit carrier. A further difference from the first two embodiments of the invention is that the multilayer circuit carrier 1, with one technology, realizes an insulation layer 7 with through contacts 14 in a predetermined pitch r, a second insulation layer 7 with elongated through contacts 14 corresponding to a rewiring structure 4. A further difference is that an electronic device 28 with elongated through contacts 14 is realized, and then an insulation layer with through contacts 14 in a predetermined pitch r is realized while at the same time, slightly enlarging the housing and thus the plastic housing composition 30.

Consequently, in the larger housing 41 made of plastic housing composition 30, a complete electronic device 28 is arranged at a device position 27 of a multilayer circuit carrier. The connection between the elongated through contacts 14 and the through contacts 14 of the substrate layer 7 is realized by a conductive adhesive 42. The conductive adhesive 42 can be replaced by a soldering connection. Consequently, the entire multilayer circuit carrier includes a buried semiconductor chip with external contacts of a first, topmost anchoring layer 12 with contact laminae 13 and underneath an insulation layer 7 with elongated, continuous through contacts 14, and finally an electrically conductive adhesive layer connected to the anchor laminae 13 of a second anchoring layer 12 located deeper. The anchor laminae 13 hold through contacts 14 in position in the bottom-most insulation layer 7 of the electronic device 28.

To produce such a multilayer circuit carrier 1, the same technology is employed twice, where a passage structure 6 is produced in an insulation layer 7 and then the two insulation layers 7 are connected to one another via their passage structures 6 and interposed anchor laminae 13.

FIG. 4 shows a schematic cross section of an electronic device 28 of a preliminary stage of the electronic device 28 in accordance with FIG. 3. Components having functions identical to those in the previous figures are identified by the same reference symbols and are not discussed separately.

The electronic device 28 shown in FIG. 4 is likewise based on a multilayer circuit carrier 1 with at least one insulation layer 7 with passage structures 6, which here are formed as rewiring structure 4. In contrast to the first two exemplary embodiments, this rewiring structure 4 in FIG. 4 is realized with passage structures 6, i.e., the passage structure is simultaneously a rewiring line 16 and a through contact 14. In this case, the rewiring line 16 can either be embodied like an elongated through contact 14 or narrower than a through contact 14 for a substrate layer 33, since this rewiring line does not have to have any external contacts whatsoever. The start of the rewiring line, which is connected to the flip-chip external contacts 34 via an anchor lamina 13, can be adapted to the flip-chip external contacts of the semiconductor chip 2 in terms of its order of magnitude and dimension.

In addition, the second end of the continuous conductor track 16 can be widened to correspond to the width of the through contacts 14 of the substrate layer 33 in FIG. 3. Consequently, the cross section of the continuous conductor track 16 illustrated here in FIG. 4 shows three regions which can have a different order of magnitude. A first region of a contact pad 25 has a microscopically dimensioned size of, for example, a few 10 μm² adapted to the flip-chip external contact 34. A second region has a macroscopic dimension for the transition contact 37, the order of magnitude of which corresponds to the external contact areas 8, which can be, for example, several 10 000 μm². Situated between the transition contact 37 and the contact pad 25 is a passage structure in the form of a continuous conductor track 16, the width of which can range, for example, from a few micrometers down to the submicron range. Such submicron widths for conductor tracks are produced with copper or nickel alloys which can be electrodeposited in correspondingly prepared trenches.

FIGS. 5A to 10 show schematic cross sections through intermediate products in the production of a multilayer circuit carrier 1 with a semiconductor chip 2 in each device position 27 of the multilayer circuit carrier 1 of a fourth embodiment of the invention. Components having functions identical to those in the previous figures are identified by the same reference symbols in FIGS. 5A to 10 and are not discussed separately.

FIGS. 5A and 5B show schematic cross sections through two self-supporting insulation layers 7 with passage structures 6. The passage structure of the insulation layer 7 shown in FIG. 5A has through contacts 14 as passage structure. The through contacts are secured by anchor laminae 13. Consequently, the through contacts 14 do not slide out of the insulation layer 7 during thermal loading of the insulation layer 7.

The insulation layer 7 shown in FIG. 5B has a through contact 14 with anchor laminae 13 and a cross-sectionally elongated structure with either a continuous metal plate 17, for example, of rectangular or square cross section, or an elongated continuous conductor track 16 in the plastic 11. Continuous conductor track 16, can be a rewiring structure and, as continuous metal plate 17 can be formed as chip island 35. Such continuous structures are produced by the same technology with which through contacts 14 are produced in an insulation layer 7. Compared with rewiring structures applied as a patterned layer on an insulation layer 7, passage structures 6 are metal-filled trenches in an insulation mask. Such an insulation mask can be chemically deposited or electrodeposited by photolithography on a metal plate, which has already been removed in FIGS. 5A and 5B. The two insulation layers 7 illustrated in FIGS. 5A and 5B are thus produced by identical method steps.

FIGS. 6A and 6B show schematic cross sections through two self-supporting insulation layers 7 with passage structures 6 and applied anchor laminae 13. The insulation layer 7 with through contacts 14 in FIG. 6B corresponds to the insulation layer 7 in FIG. 5A. The insulation layer 7 shown in FIG. 6A corresponds to the insulation layer shown in FIG. 5B and is arranged such that in FIG. 6A the anchor laminae 13 are opposite one another and can be joined one on top of the other by bringing the two insulation layers 7 together in arrow direction A. For this purpose, the anchor laminae 13 may have different materials which, if they are joined together, produce solder connections having a low melting point. In this embodiment of the invention, the upper anchor laminae 13 have a gold alloy, while the lower anchor laminae 13 have a tin alloy and the two together produce a eutectic soldering connection at low temperature.

FIG. 7 shows the intermediate product of the next step, during which the two insulation layers with passage structures 6, as shown in FIGS. 6A and 6B, are connected or joined via the anchor laminae 13. Consequently, FIG. 7 shows a schematic cross section through a pair of joined-together insulation layers 7 with anchor laminae 13 lying one on top of the other. An interspace having the thickness d is produced between the two insulation layers as a result of the joined-together anchor laminae 13. This interspace of 5 to a few 10 μm is filled with plastic 11 in the subsequent step.

FIG. 8 shows a schematic cross section through a pair of joined-together insulation layers 7 with a filled interspace between the insulation layers 7. Filling the interspace with plastic 11 or a plastic housing composition 30 gives rise to an anchoring layer 12, which holds the two insulation layers together. In this case, the lower insulation layer 7 forms a substrate layer 33 which only has through contacts 14, while the upper insulation layer 7 has passage structures 6, which can have both through contacts 14 and continuous conductor tracks and/or a continuous printed circuit board 17.

This pair of two insulation layers 7 with anchoring layer 12 arranged in between is a self-supporting part or a self-supporting plate and thus forms a multilayer circuit carrier 1, which can have many such device positions 27 arranged in rows and columns.

FIG. 9 shows a schematic cross section through a pair of joined-together insulation layers 7 with applied external contact areas 8. Coatings applied on the upper insulation layer 7 have bondable material and/or a material which together with silicon forms a eutectic having a low melting point, such as, for example, aluminum. In this fourth embodiment of the multilayer circuit carrier 1, a continuous metal plate 19 is introduced or chemically deposited or electrodeposited into the upper insulation layer 7. The metal plate is dimensioned such that it can receive a semiconductor chip and thus realize a chip island 35.

FIG. 10 shows a schematic cross section through a multilayer circuit carrier 1 with semiconductor chips 2 on a continuous metal plate 17 as chip island 35 and also a through contact 14, which, through both insulation layers, electrically connects the bonding wire 36 to the underside 9 of the circuit carrier. As a result, an electrical connection is produced between external contact area 8 and contact area 22 on the semiconductor chip 2.

FIGS. 11 to 17 show schematic cross sections through intermediate products in the production of a multilayer circuit carrier 1 with a semiconductor chip 2 in each device position 27 of the multilayer circuit carrier 1 of a fifth embodiment of the invention. Components having functions identical to those in the previous figures are identified by the same reference symbols and are not discussed separately in FIGS. 11 to 17.

FIG. 11 shows a schematic cross section through a metal plate 29 with passage structure 6 and with anchor laminae 13 on the passage structures 6. In the this method of producing a multilayer circuit carrier, a self-supporting insulation layer with passage structures 6 is not produced. Rather, the photoresist laying between the metallic passage structures 6 is removed. In this case, FIG. 11 has a through contact 14 and a continuous metal plate 17 as passage structures 6.

FIG. 12 shows a schematic cross section through a metal plate 29 with through contacts 14 and with anchor laminae 13 on the through contacts 14. In this case, the photoresist layers that initially existed between the through contacts 14 in order to electrodeposit or chemically deposit the through contacts 14 on the uncovered areas are not replaced by a plastic housing composition. Rather, the metal plate 29 is initially maintained as a supporting layer in order to leave the through contacts 14 in position. The metal plates 29 can subsequently be aligned with one another in arrow direction A. The anchor laminae 13 of the two structures of FIGS. 11 and 12 are located one on top of the other.

FIG. 13 shows a schematic cross section through the metal plates 29 of the FIGS. 11 and 12 after the anchor laminae 13 have been joined together. Since the metal plates remain present throughout and are provided for a plurality of circuit positions 27 for the production of a multilayer circuit carrier 1, the two metal plates 29 serve as a mold boundary in this implementation of the method for producing a multilayer circuit carrier. The interspaces to be filled with plastic housing composition are now larger than in FIG. 7. Moreover, the plastic does not penetrate to the external contact areas 8 of the passage structures 6 since the latter are still connected to the metal plates 29. The potting of the interspaces with plastic housing composition based on the larger interspaces is facilitated.

FIG. 14 shows a schematic cross section through the joined metal plates 29 according to FIG. 13 with filled cavities between the metal plates 29. During the filling of the cavities, the metal plates 29 can be supported by corresponding mold bodies in order that the plates do not bulge when the plastic is pressed at a high pressure of up to 15 MPa into the interspaces of such a structure as shown in FIGS. 13 and 14. After the solidification or curing or crosslinking of the plastic, the passage structures of metal are anchored in the plastic since the anchor laminae 13 are embedded in plastics composition. Moreover, this joined-together multilayered composite yields a self-supporting body or a self-supporting plate which is no longer supported by the metal plates 29.

FIG. 15 shows a schematic cross section through a self-supporting multilayer circuit carrier 1. The metal plates 29 in FIG. 14 has been removed by wet-chemical etching. This removal of the metal plates 29 is supported by the fact that the passage structures 6 are produced from nickel or a nickel alloy, while the metal plates 29 includes a copper alloy. Consequently, the copper etchant stops at the interface with the nickel. As a result, a defined metal surface of the through contacts 14 or of the passage structures 6 is present at the surfaces of the self-supporting plate-type body now present according to FIG. 15. External contacts or bondable metals can be applied to these metal areas.

FIG. 16 shows a schematic cross section through a self-supporting multilayer circuit carrier 1 with applied external contact areas 8. These external contact areas 8 are only fitted on the underside 9 of the multilayer circuit carrier 1, while bondable materials are applied to the passage structures 6 on the top side of the circuit carrier 1. This material can also be a conductive adhesive for fixing the semiconductor chip on the continuous metal plate 17 formed there as chip island 35.

FIG. 17 shows a cross section through a device position 27 of a multilayer circuit carrier 1 with applied semiconductor chip 2. The passive rear side 39 of a semiconductor chip 2 is applied to the continuous metal plate 17 by a conductive adhesive 42. Consequently, the passive rear side 39 of the semiconductor chip 2 is electrically connected to the external contact 8 via the conductive adhesive 42, the chip island 35, the two anchor laminae 13, and the through contact 14. The passive rear side 39 of the semiconductor chip 2 can thus be connected to the lowest potential of the integrated circuit with respect to the active top side 38 of the semiconductor chip 2.

In this fifth exemplary embodiment of the invention, the electrodes of the active components of the integrated circuit on the top side 38 of the semiconductor chip 2 are connected to the stacked through contact 14 via the contact areas 22 and the bonding connections 36. The through contact are electrically connected to a further external contact 8 via the two anchor laminae 13. Consequently, for example, signal pulses can be applied to the contact area 22 of the active top side 38 of the semiconductor chip 2 via the external contact and the through contacts 14 and also the anchor laminae 13 and the bonding connections 36.

FIGS. 18 to 21 show schematic cross sections through intermediate products in the production of a panel 26 with a semiconductor chip 2 in each device position based on a multilayer circuit carrier 1 of a sixth embodiment of the invention. Components having functions identical to those in the previous figures are identified by the same reference symbols and are not discussed separately for FIGS. 18 to 21.

FIG. 18 shows a schematic cross section through a pair of insulation layers 7 with passage structures 6. This pair of insulation layers 7 corresponds to the pair of insulation layers in FIG. 16, but the chip island has been significantly enlarged.

FIG. 19 shows a schematic cross section through a further pair of two insulation layers 7 with passage structures 6, which correspond to the pair of insulation layers 7 in FIG. 16.

FIG. 20 shows a schematic cross section through the pairs of FIGS. 18 and 19 after the two pairs have been joined together in arrow direction A, the external contacts 8 of one pair being joined together with the topmost contacts of the second pair of FIG. 19. As a result, four multilayer circuit carriers produced by the same technology give rise to a further structure, which is also referred to as panel 26, especially if the detail shown in FIG. 20 only represents one position of a panel 26 comprising a plurality of device positions 27. In principle, as many pairs of insulation layers with passage structures as desired can be stacked one above the other in the same way, the passage structures, as shown in FIG. 20, being able to serve not only as chip island, but also as continuous conductor tracks 16. In this case, the continuous conductor track 16 can extend on both sides to form transition contacts 37 and contact with through contacts of corresponding size at both ends of the continuous conductor track 16.

FIG. 21 shows a schematic cross section through a multilayer circuit carrier 1 with a semiconductor chip 2 which forms a part of a panel 26. Since each of the insulation plates constructed in pairs with multiple through contacts 14 is self-supporting, if the dielectric strength permits and the air humidity does not have to be shielded, the interspace having the thickness d between the insulation layers arranged in pairs can remain free and unfilled. However, if higher requirements are made of the dielectric strength, then this interspace having the thickness d is also has to be filled with corresponding insulating plastic material. The semiconductor chip 2 can be covered with a further hollow housing layer, so that the multilayer circuit carrier 1 has a semiconductor chip 2 incorporated in a hollow housing.

Figure 22:
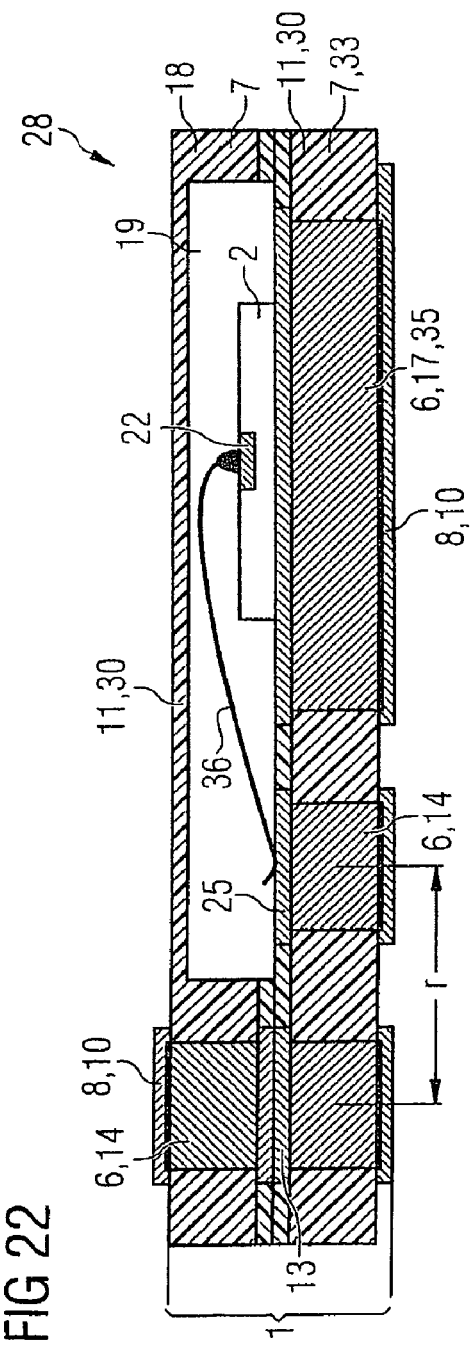
FIG. 22 shows a schematic cross section through an electronic device with a multilayer circuit carrier with a hollow housing and a semiconductor chip of a seventh embodiment of the invention.

FIG. 22 shows a schematic cross section through an electronic device 28 with a multilayer circuit carrier 1 with a hollow housing 18 and with a semiconductor chip 2 in accordance with a seventh embodiment of the invention. Components having functions identical to those in the previous figures are identified by the same reference symbols and are not discussed separately.

The multilayer circuit carrier 1 of FIG. 22 is realized by joining together a substrate carrier with passage structure 6, which, besides the through contacts 14, additionally has a continuous metal plate 17 formed as chip island 35. In this case, both the position of the chip island 35 and the position of the passage contacts 14 are predetermined with a pitch r. A second insulation layer 7 with through contacts 14 is formed such that a cutout 19 is present, which can serve as a hollow housing 18 for the electronic device 28. Consequently, by the same technology, both a lower insulation layer 7 with passage structures 6 and an upper insulation layer 7 with passage structures 6 and cutouts 19 are joined together by the anchor laminae 13, thereby producing a multilayer circuit carrier 1 with a buried semiconductor chip 2.

Figure 23:
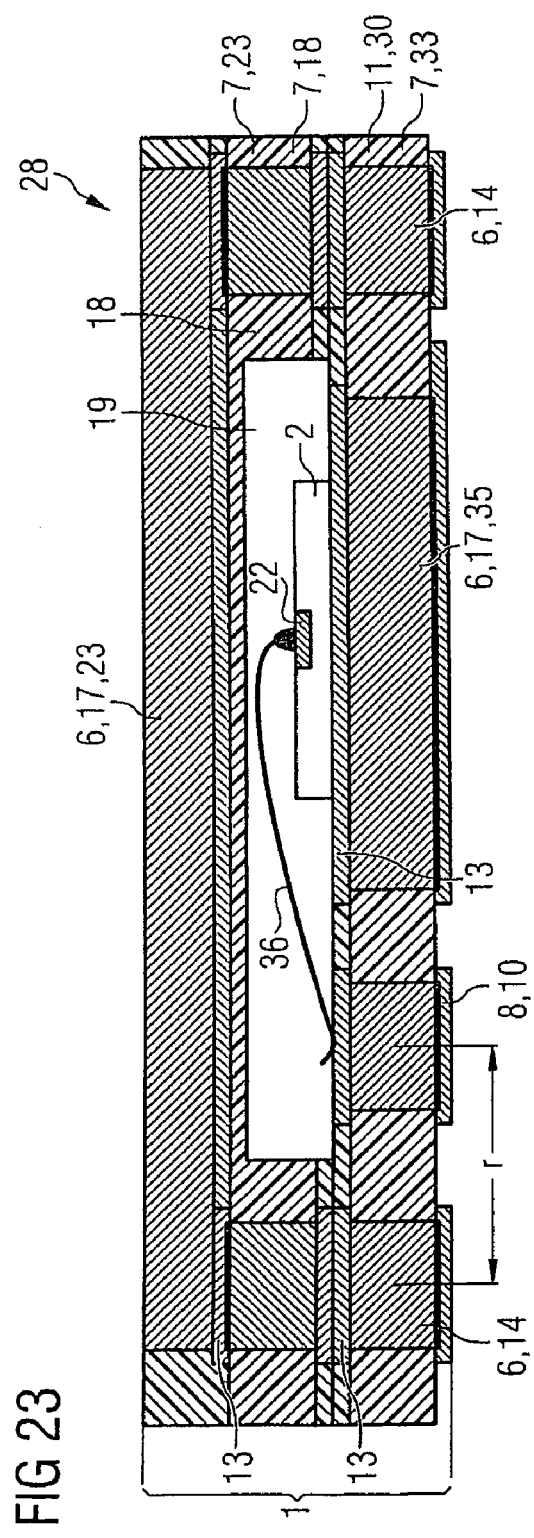
FIG. 23 shows a schematic cross section through an electronic device with a multilayer circuit carrier with a hollow housing and a semiconductor chip of a eighth embodiment of the invention.

FIG. 23 shows a schematic cross section through an electronic device 28 with a multilayer circuit carrier 1 with a hollow housing 18 and a semiconductor chip 2 of an eighth embodiment of the invention. Components having functions identical to those in the previous figures are identified by the same reference symbols and are not discussed separately.

In FIG. 23, a further insulation layer 7 is applied to the multilayer circuit carrier 1 of FIG. 22. The insulation layer has a continuous, large-area metal plate 17, which is connected at its edges via through contacts 14 to external contact areas 8 on the underside 9 of the multilayer circuit carrier 1. This construction completely shields the semiconductor chip 2 in its hollow housing 18, with the result that this multilayer circuit carrier can be used for sensitive radiofrequency devices 28.

Figure 24:
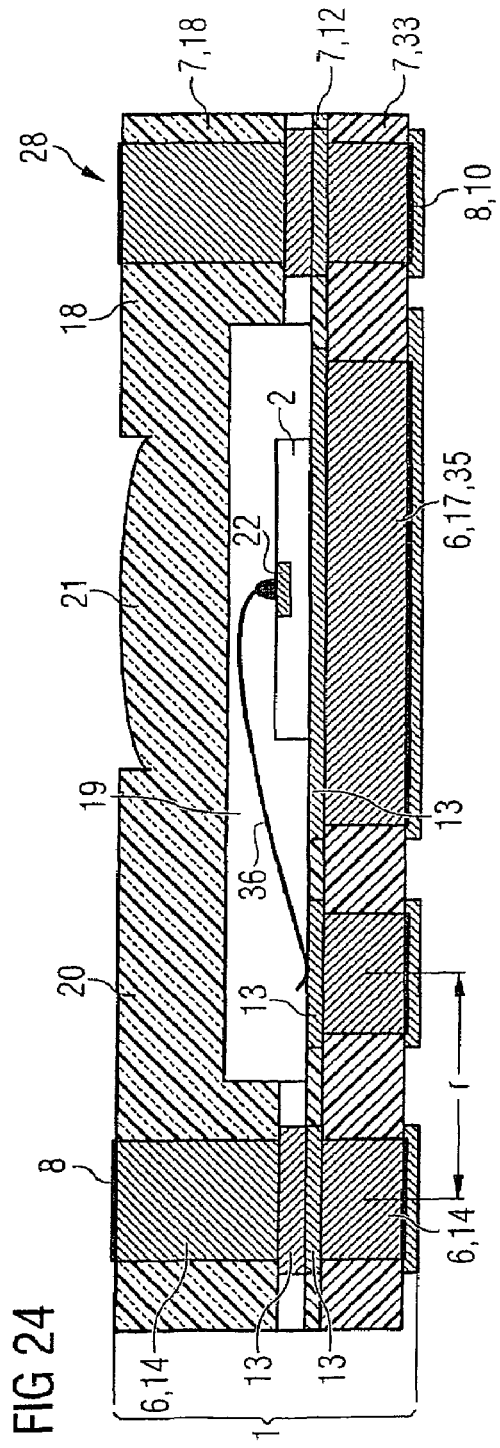
FIG. 24 shows a schematic cross section through an electronic device with a multilayer circuit carrier with a hollow housing and a semiconductor chip of a ninth embodiment of the invention.

FIG. 24 shows a schematic cross section through an electronic device 28 with a multilayer circuit carrier 1 with a hollow housing 18 and a semiconductor chip 2 of a ninth embodiment of the invention. Components having functions identical to those in the previous figures are identified by the same reference symbols and are not discussed separately.

This ninth embodiment of the invention differs from the previous embodiments of the invention by the fact that the hollow housing 18 is not produced from a plastic housing composition 30, as in FIGS. 22 and 23, but rather from a transparent plastic 20. A through contact 14 can be led through said transparent plastic 20 in order to feed signals and supply voltages also from the top side of the multilayer circuit carrier 1. In this ninth embodiment of the invention, the transparent plastic 20 forming the hollow housing 18 is formed as detector lens 21 above the semiconductor chip 2 in order to obtain a higher detector efficiency or a higher light sensitivity.

Figure 25:
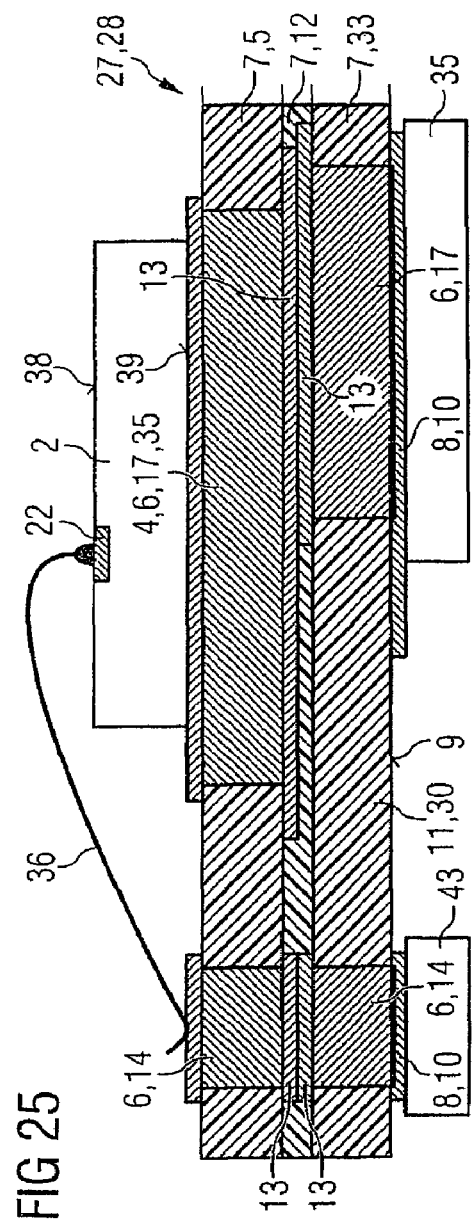
FIG. 25 shows a multilayer circuit carrier of a tenth embodiment of the invention.

FIG. 25 shows a multilayer circuit carrier 1 of a tenth embodiment of the invention. Components having functions identical to those in the previous figures are identified by the same reference symbols and are not discussed separately.

In this embodiment of the invention, a flat conductor frame with a chip island 35 and flat conductors 43 is connected to a semiconductor chip 2, in the case of which the size of the semiconductor chip 2 is neither compatible with the size of the chip island 35 of the flat conductor frame nor is the pitch of the flat conductors adapted to the pitch of the contact areas 22 of the semiconductor chip 2. In such a case, a multilayer circuit carrier 1 can be used to adapt the orders of magnitude to one another with tenable costs. For this purpose, a lower insulation layer 7 with a continuous metal plate 17 is provided, whose area and distance from a through contact 14 correspond to the area of the chip island 35 of the flat conductor frame and the distance between said island and the flat conductor 43. In an insulation layer 7 arranged thereon, provision is made of passage structures with a continuous metal plate 17, whose size is adapted to the semiconductor chip 2. A corresponding through contact 14, which has a bondable coating and is electrically connected to the contact areas via a bonding connection, is connected to the flat conductor 43 of the flat conductor frame via the underlying through contact 14 of the underlying insulation layer 7 and via the external contact area 8.

FIG. 26 shows a multilayer circuit carrier 1 of an eleventh embodiment of the invention. Components having functions identical to those in the previous figures are identified by the same reference symbols and are not discussed separately.

This exemplary embodiment demonstrates how, with the aid of the multilayer circuit carrier according to the invention, a large chip island 35 of a flat conductor frame, which island is arranged at a relatively small distance from a flat conductor 43, can be populated with two significantly smaller semiconductor chips 2. In this eleventh embodiment of the invention, two insulation layers 7 are stacked one above the other and are connected to one another via the anchor laminae 13, so that, with the upper insulation layer, it is possible to realize an arbitrary structure independently of the size and arrangement of the chip island 35 of the flat conductor frame and of the flat conductor 43.

FIG. 27 shows a multilayer circuit carrier 1 of a twelfth embodiment of the invention. Components having functions identical to those in the previous figures are identified by the same reference symbols and are not discussed separately.

In the case of this exemplary embodiment of FIG. 27, a semiconductor chip 2 is arranged on a plurality of flat conductors 43, which are arranged in a predetermined pitch r, which semiconductor chip has a connection to at least one of the flat conductors 43 via its contact areas 22 and the passive rear side 39 of which semiconductor chip is electrically connected to another of the flat conductors 43. This embodiment of the invention according to FIG. 27 also shows the possibility of realizing arbitrary passage structures on the second insulation layer with the multilayer circuit carrier 1 according to the invention, so that it is possible to connect different semiconductor chips 2 with a totally independent, a real distribution to predetermined flat conductors 43 of a flat conductor frame with a predetermined pitch r.

FIG. 28 shows a multilayer circuit carrier 1 of a thirteenth embodiment of the invention. Components having functions identical to those in the previous figures identified by the same reference symbols and are not discussed separately.

This thirteenth embodiment according to FIG. 28 differs from the previous embodiments by the fact that the multilayer circuit carrier 1 has passive components 3 which are fitted with their electrodes 44 and an arbitrary distance between the electrodes 44 on a flat conductor frame having flat conductors 43 arranged in a predetermined pitch r. For this purpose, provision is again made of a multilayer circuit carrier 1 with at least two insulation layers 7 with passage structures 6, which enable the discrete components 3 to be electrically connected by their arbitrarily dimensioned electrodes 44 to the external flat conductors 43 of a flat conductor frame with a predetermined pitch r. Consequently, the multilayer circuit carrier 1 according to the invention enables the construction of an entire module comprising discrete components and/or semiconductor chips and also the adaptation of these structures with their corresponding electrodes 44 or their contact areas 22 to predetermined pitches, be they the pitches r of external contact areas 8 or, as shown in the example of FIGS. 25 to 28, the pitches r of flat conductors 43.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A multilayer circuit carrier, comprising:
   at least one semiconductor chip and/or at least one discrete component;
   at least one rewiring layer, the rewiring layer comprising rewiring structures and an insulation layer, wherein the rewiring structures comprise through contacts, continuous conductor tracks and/or continuous metal plates in said insulation layer of the rewiring layer, and the rewiring layer is connected to said at least one semiconductor chip and/or at least one discrete component;
   at least one insulation layer comprising passage structures;
   an external contact layer on an underside of the circuit carrier;
   external contact areas arranged at a predetermined pitch on said external contact layer; and
   an anchoring layer arranged between the rewiring layer and the insulation layer, the anchoring layer comprising anchor regions that fix a position of the passage structures,
   wherein the external contact areas are electrically connected to the rewiring structures via the passage structures and the anchor regions.

2. The circuit carrier as claimed in claim 1, wherein the insulation layer comprises a substrate layer and the passage structures comprising through contacts at a predetermined pitch in said substrate layer, wherein the predetermined pitch of the through contacts correspond to the pitch of the external contact areas.

3. The circuit carrier as claimed in claim 1, wherein the rewiring structures comprise electrically conductively filled plastic.

4. A multilayer circuit carrier comprising:
   at least one semiconductor chip and/or at least one discrete component;
   at least one rewiring layer comprising rewiring structures, wherein the rewiring layer is connected to said least one semiconductor chip and/or at least one discrete component;
   an external contact layer on an underside of the circuit carrier;
   external contact areas arranged at a predetermined pitch on said external contact layer;
   two insulation layers each comprising passage structures; and
   two anchoring layers arranged adjacent the rewiring layer, each anchoring layer comprising anchor regions that fix a position of the passage structures and anchor laminae, and wherein the anchoring laminae of one anchoring layer is on top of the anchoring laminae of the other anchoring layer;
   wherein the external contact areas are electrically connected to the rewiring structures via the passage structures and the anchor regions.

5. The circuit carrier as claimed in claim 4, wherein the insulation layers are arranged in pairs and wherein the anchor laminae, of one anchoring layer is joined to the anchoring laminae of the other anchoring layer between each pair of insulation layers, and wherein the anchor laminae comprises an eutectic solder.

6. The circuit carrier as claimed in claim 5, wherein the solder comprises least one of gold, tin, or aluminum.

7. A multilayer circuit carrier comprising:
   at least one semiconductor chip and/or at least one discrete component;
   at least one rewiring layer comprising rewiring structures, wherein the rewiring layer is connected to said at least one semiconductor chip and/or at least one discrete component;
   at least one insulation layer comprising passage structures, wherein the insulation layer comprises a cutout for receiving the at least one semiconductor chip and/or at least one discrete component;
   an external contact layer on an underside of the circuit carrier;
   external contact areas arranged at a predetermined pitch on said external contact layer; and
   an anchoring layer arranged between the rewiring layer and the insulation layer, the anchoring layer comprising anchor regions that fix a position of the passage structures;
   wherein the external contact areas are electrically connected to the rewiring structures via the passage structures and the anchor regions.

8. A multilayer circuit carrier comprising:
   at least one semiconductor chip and/or at least one discrete component;
   at least one rewiring layer comprising rewiring structures, wherein the rewiring layer is connected to said least one semiconductor chip and/or at least one discrete component;
   at least one insulation layer comprising passage structures, wherein the insulation layer comprises a detector lens of transparent plastic;
   an external contact layer on an underside of the circuit carrier;
   external contact areas arranged at a predetermined pitch on said external contact layer; and
   an anchoring layer arranged between the rewiring layer and the insulation layer, the anchoring layer comprising anchor regions that fix a position of the passage structures;

wherein the external contact areas are electrically connected to the rewiring structures via the passage structures and the anchor regions.

9. A multilayer circuit carrier comprising:
at least one semiconductor chip and/or at least one discrete component;
at least one rewiring layer comprising rewiring structures, wherein the rewiring layer is connected to said least one semiconductor chip and/or at least one discrete component;
at least one insulation layer comprising passage structures, wherein the insulation layer comprises a continuous metal shielding plate;
an external contact layer on an underside of the circuit carrier;
external contact areas arranged at a predetermined pitch on said external contact layer; and
an anchoring layer arranged between the rewiring layer and the insulation layer, the anchoring layer comprising anchor regions that fix a position of the passage structures;
wherein the external contact areas are electrically connected to the rewiring structures via the passage structures and the anchor regions.

10. A multilayer circuit carrier comprising:
at least one semiconductor chip and/or at least one discrete component;
at least one rewiring layer comprising rewiring structures, wherein the rewiring layer is connected to said least one semiconductor chip and/or at least one discrete component;
at least one insulation layer comprising passage structures;
an external contact layer on an underside of the circuit carrier;
external contact areas arranged at a predetermined pitch on said external contact layer; and
an anchoring layer arranged between the rewiring layer and the insulation layer, the anchoring layer comprising anchor regions that fix a position of the passage structures,
wherein the external contact areas are electrically connected to the rewiring structures via the passage structures and the anchor regions, and the semiconductor chip comprises contact areas and contact balls arranged thereon and in contact with contact pads of the rewiring structures using flip-chip technology.

11. A multilayer circuit carrier comprising:
at least one semiconductor chip and/or at least one discrete component;
at least one rewiring layer comprising rewiring structures, wherein the rewiring layer is connected to said least one semiconductor chip and/or at least one discrete component;
at least one insulation layer comprising passage structures;
an external contact layer on an underside of the circuit carrier;
external contact areas arranged at a predetermined pitch on said external contact layer;
an anchoring layer arranged between the rewiring layer and the insulation layer, the anchoring layer comprising anchor regions that fix a position of the passage structures; and
a plurality of device positions each for individual ones of a plurality of devices;
wherein the external contact areas are electrically connected to the rewiring structures via the passage structures and the anchor regions.

12. A panel comprising a plurality of multilayered circuit carriers that are stacked on top of each other and connected to one another via through contacts, wherein each multilayered circuit carrier comprises:
at least one semiconductor chip that and/or at least one discrete component;
at least one rewiring layer comprising rewiring structures, wherein the rewiring layer is connected to said least one semiconductor chip and/or at least one discrete component;
at least one insulation layer comprising passage structures;
an external contact layer on an underside of the circuit carrier;
external contact areas arranged at a predetermined pitch on said external contact layer; and
an anchoring layer arranged between the rewiring layer and the insulation layer, the anchoring layer comprising anchor regions that fix a position of the passage structures,
wherein the external contact areas are electrically connected to the rewiring structures via the passage structures and the anchor regions.

13. An electronic device comprising the panel of claim 12.

14. The electronic device as claimed in claim 13, wherein the at least one rewiring structure is made of conductive plastic.

15. The electronic device as claimed in claim 14, and comprising two insulation layers each comprising elongated through contacts, the elongated through contacts of one of the insulation layers being arranged at a predetermined pitch that corresponds to the predetermined pitch of said external contact areas, the through contacts of the two insulation layers being electrically connected to one another and packaged in a common plastic housing composition.

16. An electronic device, comprising:
at least one multilayer circuit carrier, the circuit carrier comprising at least one semiconductor chip and/or at least one discrete component, at least one rewiring layer made of conductive plastic, the rewiring layer comprising rewiring structures and being connected to said at least one semiconductor chip and/or at least one discrete component, two insulation layers each comprising passage structures, an external contact layer on an underside of the circuit carrier, external contact areas arranged at a predetermined pitch on the external contact layer, wherein each insulation layer comprises elongated through contacts, the elongated through contacts of one of the insulation layers being arranged at a predetermined pitch that corresponds to the predetermined pitch of said external contact areas, the through contacts of the two insulation layers being electrically connected to one another and packaged in a common plastic housing composition, and an anchoring layer arranged between the rewiring layer and the insulation layer, the anchoring layer comprising anchor regions that fix a position of the passage structures, wherein the external contact areas are electrically connected to the rewiring structure via the passage structures and the anchor regions.

* * * * *